(12) United States Patent
Shido et al.

(10) Patent No.: US 8,847,431 B2
(45) Date of Patent: Sep. 30, 2014

(54) SEMICONDUCTOR DEVICE INCLUDING A PAIR OF SHIELD LINES

(75) Inventors: Taihei Shido, Tokyo (JP); Mototsugu Fujimitsu, Machida (JP); Nobuhiro Oodaira, Hachioji (JP); Naoki Kitai, Tsuchiura (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 536 days.

(21) Appl. No.: 13/289,599

(22) Filed: Nov. 4, 2011

(65) Prior Publication Data

US 2012/0112563 A1 May 10, 2012

(30) Foreign Application Priority Data

Nov. 4, 2010 (JP) ................................. 2010-247772

(51) Int. Cl.
*H04B 3/00* (2006.01)
(52) U.S. Cl.
USPC ........................................................ 307/91
(58) Field of Classification Search
USPC ........................................................ 307/91
See application file for complete search history.

(56) References Cited

U.S. PATENT DOCUMENTS

2008/0106316 A1* 5/2008 Ha .................................. 327/299

FOREIGN PATENT DOCUMENTS

| JP | 2000-353785 | 12/2000 |
| JP | 2006-173382 | 6/2006 |

* cited by examiner

*Primary Examiner* — Robert L. Deberadinis
(74) *Attorney, Agent, or Firm* — Young & Thompson

(57) ABSTRACT

A semiconductor device includes a first circuit, a second circuit, a first wire, and a pair of shield lines. The first circuit includes a voltage generating circuit generating a predetermined voltage and produces the predetermined voltage at an output end thereof. The first wire connects the output end of the first circuit to an input end of the second circuit. The pair of shield lines is disposed so as to sandwich the first wire therebetween. One of the shield lines is supplied with a power supply potential for driving at least one of the voltage generating circuit and the second circuit. Another of the shield lines is supplied with a ground potential for driving at least one of the voltage generating circuit and the second circuit.

15 Claims, 16 Drawing Sheets

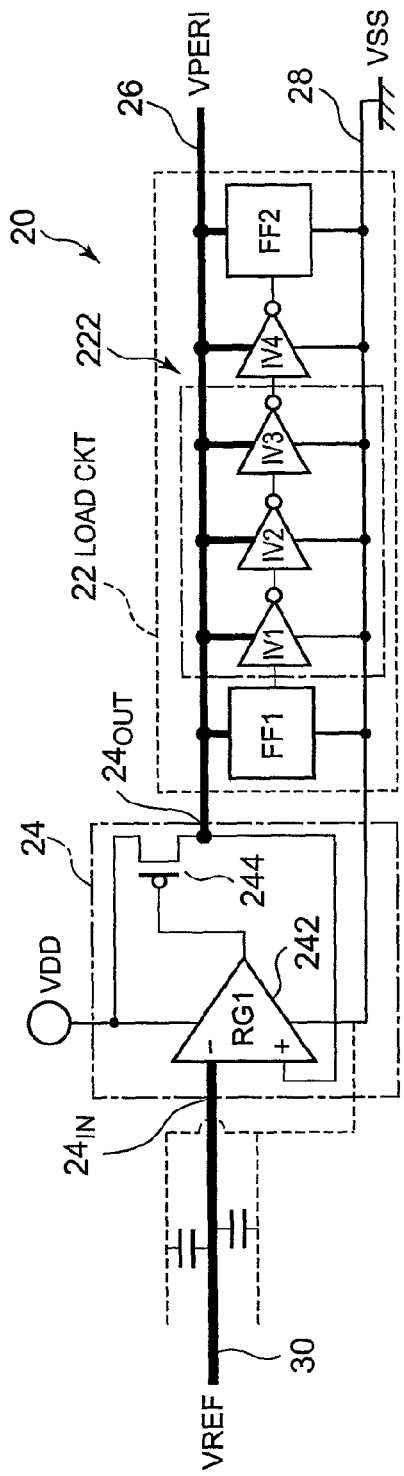
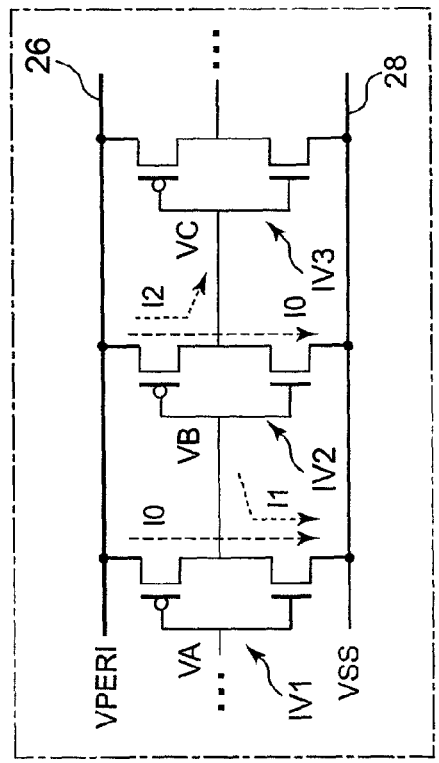
FIG. 1A RELATED ART
FIG. 1B RELATED ART

SEMICONDUCTOR DEVICE INCLUDING A PAIR OF SHIELD LINES

This application is based upon and claims the benefit of priority from Japanese patent application No. 2010-247772, filed on Nov. 4, 2010, the disclosure of which is incorporated herein in its entirety by reference.

BACKGROUND OF THE INVENTION

1. Field of the Invention

This invention relates to a semiconductor device and, in particular, to a technique for transmitting a predetermined voltage such as a reference voltage to away areas on a semiconductor chip.

2. Description of Related Art

In semiconductor devices, a reference voltage (VREF) generated by an internal voltage generating circuit or the like is transmitted via wires to various circuits wired on a semiconductor chip. Circuits required to the reference voltage are not to ones disposed in the proximity of the internal voltage generating circuit. Therefore, there may be a case where the reference voltage is transmitted via wires to away areas on the semiconductor chip.

Something else, instruction signals required to drive various circuits, input/output data signals transmitted/received between a memory circuit and an input/output circuit, and so on are transmitted via wires.

Various prior art documents related to this invention are already known.

By way of example, JP-A-2006-173382 (which will be also called Patent Document 1) discloses a data output portion for a DRAM chip in which first and second ground wires are disposed so as to sandwich first and second control signal lines from outside which are connected to gates of a pMOS-FET and an nMOSFET constituting a data output CMOS driver, respectively. The first and the second ground wires lie between a pair of the first and the second control lines and another pair thereof thereby shielding the pair of the first and the second control lines against noises due to the other pair thereof.

In addition, JP-A-2000-353785 (which will be also called Patent Document 2) discloses a semiconductor device which can prevent any effect of noises of other circuits in a semiconductor chip and noises of coupling capacitance and which can supply a reference voltage to a driving circuit with stability. Shielding wires are disposed around a wire for the reference voltage $V_R$. Each shielding wire is fixed to a constant voltage (a ground potential). It is possible to prevent noises due to a capacitance coupling to a substrate by disposing a shielding wire under the wire for the reference voltage $V_R$, it is possible to prevent noises due to a capacitance coupling to adjacent wires by disposing shielding wires both sides of the wire for the reference voltage $V_R$, and it is also prevent noises due to a capacitance coupling via an upper space by disposing a shielding wire above the wire for the reference voltage $V_R$.

It is desirable that a voltage transmitting in a wire has little effect of noises (coupling noises) due to a capacitance coupling from other circuit or wires. This is because it prevents the reference voltage from fluctuating by receiving the noises (the coupling noises) from other circuits in the semiconductor chip.

As an art for reducing the noises (the coupling noises), an art for wiring shield lines along a wire for transmitting a voltage is known, as in the manner which is disclosed in the above-mentioned Patent Documents 1 and 2. The shield lines are generally fixed to the ground potential having relatively less fluctuations and it is therefore reduce the coupling noises from the other circuits or the other wires.

On the other hand, according to a study by the present inventors, it turned out that it is susceptible to improvement in regard to a shielding method in which shield lines with a fixed potential are put side by side a transmission wire, in the manner which will later be described in conjunction with FIGS. 1A, 1B, 2, 3, 4, 5A, 5B, and 5C. In brief, noises can occur in the ground potential or a power supply potential to which the shield lines are fixed per se.

SUMMARY

The present invention seeks to solve one or more of the above problems, or to improve upon those problems at least in part.

In one embodiment, there is provided a device that includes a first circuit including a voltage generating circuit generating a predetermined voltage and producing the predetermined voltage at an output end thereof, a second circuit having an input end, a first wire connecting the output end of the first circuit with the input end of the second circuit, and a pair of shield lines disposed so as to sandwich the first wire therebetween. One of the shield lines is supplied with a power supply potential for driving at leant one of the voltage generating circuit and the second circuit. Another of the shield lines is supplied with a ground potential for driving at least one of the voltage generating circuit and the second circuit.

Advantageous Effect of the Invention

In one aspect, it is possible to effectively shield noise transmission because the first wire is sandwiched between the pair of shield line one of which is supplied with the power supply potential and another of which is supplied with the ground potential.

BRIEF DESCRIPTION OF THE DRAWINGS

The above features and advantages of the present invention will be more apparent from the following description of certain preferred embodiments taken in conjunction with the accompanying drawings, in which:

FIG. 1A is a block diagram showing a driving portion of a reception side;

FIG. 1B is a circuit diagram showing a part of a load circuit in the driving portion illustrated in FIG. 1A in detail;

DETAILED DESCRIPTION OF THE PREFERRED EMBODIMENTS

Figure 2:
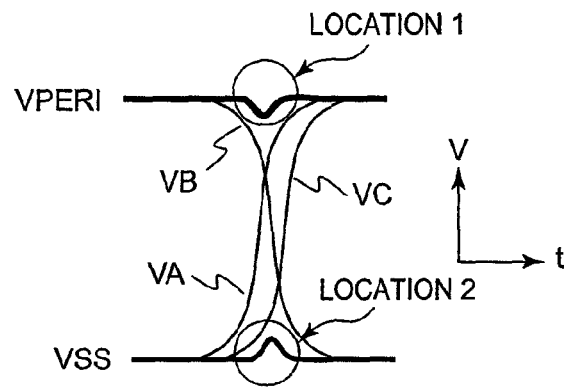
FIG. 2 is a waveform view showing the general outlines of signal transitions in the load circuit illustrated in FIG. 1B.

Before description of the present invention, the prior art will be explained in detail with reference to FIGS. 1A, 1B, 2, 3, 4, 5A, 5B, and 5C in order to facilitate the understanding of the present invention.

Now, the description will proceed to a mechanism where noises occur in a ground potential or a power supply potential per se.

FIG. 1A shows a driving portion 20 of a reception side while FIG. 1B shows a detailed view of a part of a load circuit in the driving portion 20 that is a rectangular portion enclosed by alternate long and short dashed lines in FIG. 1A.

As shown in FIG. 1A, the driving portion 20 comprises the load circuit depicted at 22 and a load driving circuit 24. The load driving circuit 24 is a circuit for driving the load circuit 22 in response to a reference voltage VREF at an input end $24_{IN}$ thereof. The load driving circuit 24 comprises a comparison circuit (RG1) 242 composed of an operational amplifier and a p-channel MOSFET (metal oxide semiconductor field effect transistor) 244. The comparison circuit 242 is also referred to as a regulator. The comparison circuit 242 is driven by a power supply potential VDD and a ground potential VSS. Inasmuch as the comparison circuit 242 has an output terminal connected to a gate electrode of the p-channel MOSFET 244, the MOSFET 244 generates, as an internal generated voltage VPERI, a drain voltage dependent on an output voltage (a gate voltage) of the comparison circuit 242. The internal generated voltage VPERI is supplied to a non-inverting input terminal (+) of the comparison circuit 242 and is regulated so that it is equal to the reference voltage VREF supplied to an inverting input terminal (−) thereof. The p-channel MOSFET 244 has a drain electrode which is an output terminal $24_{OUT}$ of the load driving circuit 24. The output terminal $24_{OUT}$ of the load driving circuit 24 is connected to an internal power supply line 26 to which the internal generated voltage VPWERI is supplied.

The load circuit 22 is connected between the internal power supply line 26 and a grounding line 28 to which the ground potential VSS is supplied. The illustrated load circuit 22 comprises a first flip-flop circuit FF1, a second flip-flop circuit FF2, and a logic portion 222 connected therebetween. The illustrated logic portion 222 comprises first through fourth CMOS inverter circuits IV1, IV2, IV3, and IV4. Each of the first through the fourth CMOS inverter circuits IV1 to IV4 comprises a p-channel MOSFET and an n-channel MOSFET.

FIG. 1B is a circuit diagram showing a portion of the first through the third inverter circuits IV1 to IV3 in the load circuit 22 in FIG. 1A in detail.

As shown in FIG. 1B, in each of the first through the fourth inverter circuits IV1 to IV3, a source electrode of the p-channel MOSFET is connected to the internal power supply line 26, a source electrode of the n-channel MOSFET is connected to the grounding line 28, a drain electrode of the p-channel MOSFET and a drain electrode of the n-channel MOSFET are connected to an output node with each other, and a gate electrode of the p-channel MOSFET and a gate electrode of the n-channel MOSFET are connected to an input node with each other.

The input node of the first inverter circuit IV1 is connected to an output end of the first flip-flop circuit FF1. The output node of the first inverter circuit IV1 is connected to the input node of the second inverter circuit IV2 while the output node of the second inverter circuit IV2 is connected to the input node of the third inverter circuit IV3. The output node of the third inverter circuit IV3 is connected to the input node of the fourth inverter circuit IV4.

In the example being illustrated in FIG. 1B, the input node of the first inverter circuit IV1 has a first potential VA, the input node of the second inverter circuit IV2 has a second potential VB, and the input node of the third inverter circuit IV3 has a third potential VC. Under the circumstances, it will be assumed that the first potential VA takes a logic "L" level, namely, is equal to the ground potential VSS. In this event, the second potential VB takes a logic "H" level, namely, is equal to the internal generated voltage VPERI and the third potential VC takes the logic "L" level, namely, is equal to the ground potential VSS.

Under the circumstances, it will be assumed that the first potential VA changes from the logic "L" level or the ground potential to the logic "H" level or the internal generated voltage VPERI, as shown in FIG. 2.

In this event, as shown in FIG. 1B, a flow-through current I0 flows in the first and the second inverter circuits IV1 and IV2, a discharge current I1 flows from the input node of the second inverter circuit IV2 to the source electrode of the n-channel MOSFET of the first inverter circuit IV1, and a charging current I2 flows from the source electrode of the p-channel MOSFET of the second inverter circuit IV2 to the input node of the third inverter circuit IV3.

More specifically, the flow-through current I0 is a flow-through current when an input voltage lies in the vicinity of a level of {(VPERI−VSS)/2}. The discharge current I1 discharges the next stage and is a current on pulling out to the ground potential VSS. The charging current I2 charges the next stage and is a current on lifting up to the internal generated voltage VPREI.

FIG. 2 is a waveform diagram showing the general outlines of signal transitions in the load circuit 22. In FIG. 2, a lateral axis represents a time instant t while a longitudinal axis represents a voltage V.

As shown in FIG. 2, at a location 1, the internal generated voltage VPERI on the internal power supply line 26 drops down temporarily due to the flow-through current I0 and the charging current I2. Likewise, at a location 2, the ground potential VSS on the grounding line 28 rises up temporarily due to the flow-through current I0 and the discharge current I1. A drop in the internal generated voltage VPERI and a rise in the ground potential VSS result in noises to power supply wires (the internal power supply line 26 and the grounding line 28).

Next, the description will proceed to demerits in a case where such noises occur to a shield line per se.

Figure 3:
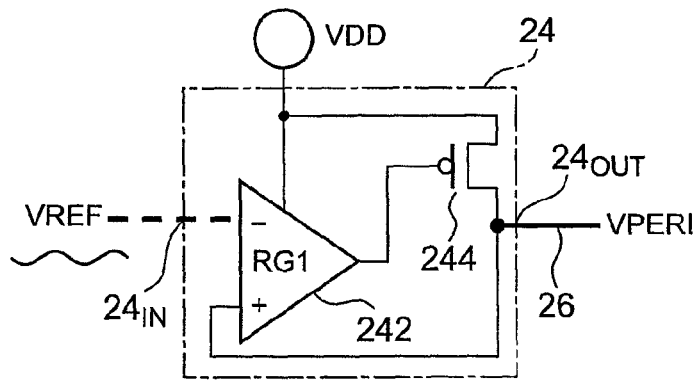
FIG. 3 is a circuit diagram showing the load driving circuit illustrated in FIG. 1A.
Figure 4:
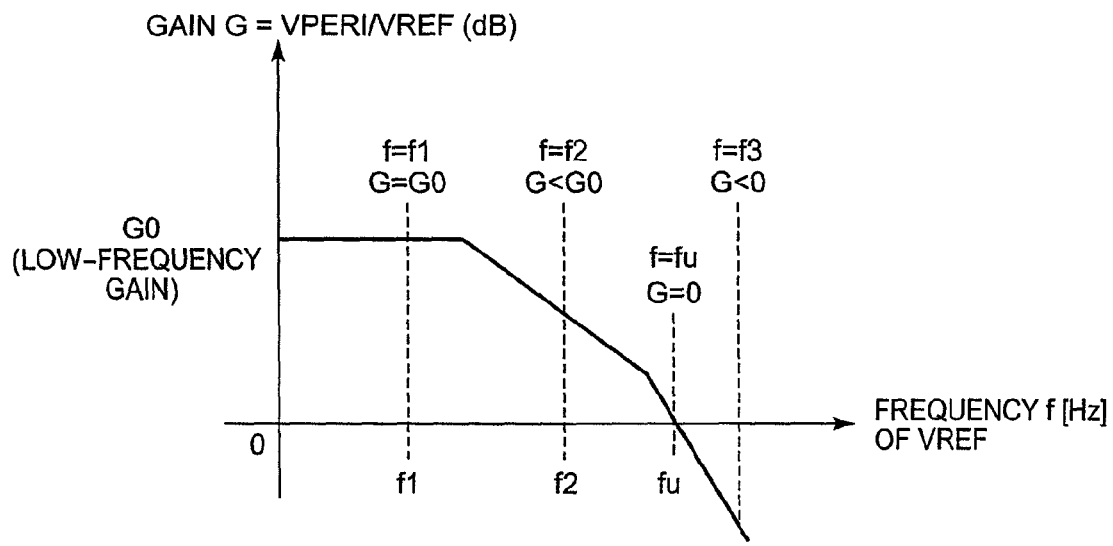
FIG. 4 is a characteristic view showing an overview of a frequency-gain plot in an operational amplifier (RG1) serving as a comparison circuit (a regulator) used in the load driving circuit illustrated in FIG. 3.

FIG. 3 is a circuit diagram showing the load driving circuit 24 illustrated in FIG. 1A while FIG. 4 is a characteristic view showing an overview of a frequency-gain plot in the operational amplifier (RG1) 242 serving as the comparison circuit (the regulator) used in the load driving circuit 24. In FIG. 4, a lateral axis represents a frequency [Hz] of the reference voltage VREF which is the input signal while a longitudinal axis represents a gain G (dB) of the operational amplifier (RG1) 242. The gain G is represented by (VPERI/VREF) (dB).

In FIG. 4, it is assumed that the gain G of the operational amplifier (GR1) 242 has a low-frequency gain G0 when the frequency f of the reference voltage VREF is equal to a first frequency f1 which is a low frequency. When the gain G of the operational amplifier (GR1) 242 is 0 (dB), the frequency f of the reference voltage VREF is represented by a gain-zero frequency fu. When the frequency f of the reference voltage VREF is equal to a second frequency f2 which is higher than the first frequency f1 and which is lower than the gain-zero frequency fu, the gain G of the operational amplifier (RG1) 242 is lower than the low-frequency gain G0 and is higher than 0 (dB) (i.e. 0<G<G0). On the other hands, when the frequency f of the reference voltage VREF is equal to a third frequency f3 which is higher than the gain-zero frequency fu, the gain G of the operational amplifier (GR1) is lower than 0 (dB) (i.e. G<0).

That is, the operational amplifier (RG1) 242 has a characteristic where the higher the frequency f of the input signal (reference voltage) VREF becomes, the lower the gain G of the operational amplifier (RG1) 242 becomes. If the gain G of the operational amplifier (RG1) 242 is positive, the operational amplifier (RG1) 242 acts to amplify an oscillation amplitude of the input signal VREF. If the gain G of the operational amplifier (RG1) 242 is negative, the operational amplifier (RG1) 242 acts to attenuate the oscillation amplitude of the input signal VREF.

Figure 5:
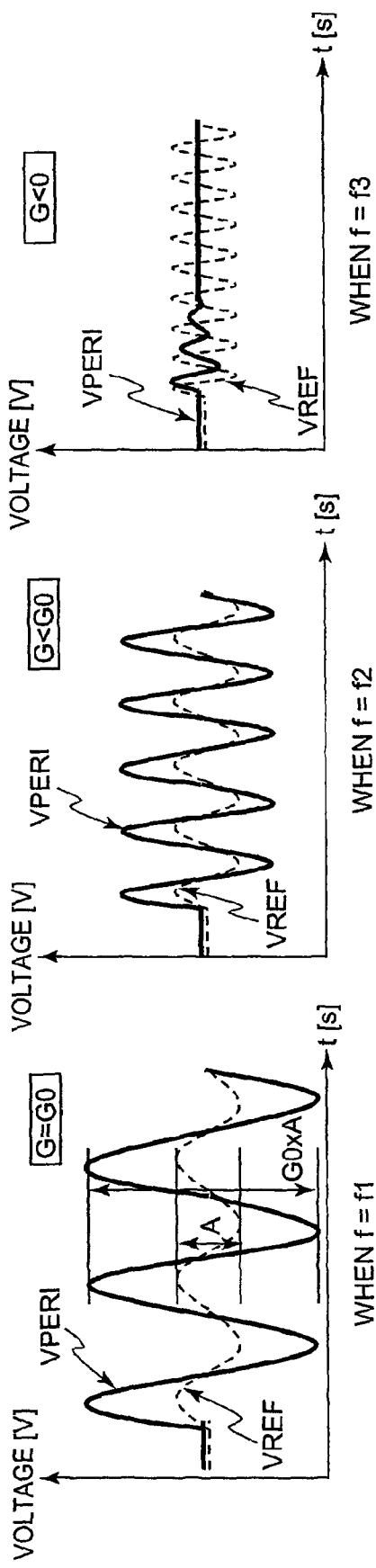
FIG. 5A is a characteristic view showing a variation characteristic of an internal generated voltage VPERI produced by the load driving circuit when a frequency f of an input signal (reference voltage) VREF is equal to a first frequency f1.
FIG. 5B is a characteristic view showing a variation characteristic of the internal generated voltage VPERI produced by the load driving circuit when the frequency f of the input signal (reference voltage) VREF is equal to a second frequency f2.
FIG. 5C is a characteristic view showing a variation characteristic of the internal generated voltage VPERI produced by the load driving circuit when the frequency f of the input signal (reference voltage) VREF is equal to a third frequency f3.

FIGS. 5A, 5B, and 5C show explanation views about them. Each of FIGS. 5A to 5C, a lateral axis represents a time instant t [s] while a longitudinal axis represents a voltage [V].

FIG. 5A shows a variation characteristic of the internal generated voltage VPERI produced by the load driving circuit 24 when the frequency f of the input signal (reference voltage) VREF is equal to the first frequency f1. FIG. 5B shows a variation characteristic of the internal generated voltage VPERI produced by the load driving circuit 24 when the frequency f of the input signal (reference voltage) VREF is equal to the second frequency f2. FIG. 5C shows a variation characteristic of the internal generated voltage VPERI produced by the load driving circuit 24 when the frequency f of the input signal (reference voltage) VREF is equal to the third frequency f3.

It will be assumed that the input signal (reference voltage) VREF oscillates, for example, so as to have amplitude A when the frequency f of the input signal (reference voltage) VREF is equal to the first frequency f1, as shown in FIG. 5A. In this event, the internal generated voltage VPERI produced by the load driving circuit 24 has amplitude G0 times as large as amplitude A.

On the other hand, as shown in FIG. 5B, when the frequency f of the input signal (reference voltage) VREF is equal to the second frequency f2, the amplitude of the internal generated voltage VPERI produced by the load driving circuit 24 becomes lower in comparison with the case illustrated in FIG. 5A.

Furthermore, as shown in FIG. 5C, when the frequency f of the input signal (reference voltage) VREF is equal to the third frequency f3, the amplitude of the internal generated voltage VPERI produced by the load driving circuit 24 trends attenuation and finally becomes zero.

In the manner which is described above, it is understood that, when noise components occur in the input signal (reference voltage) VREF via the shield line, the load driving circuit 24 amplifies the noise components to oscillate the internal generated voltage VPERI in a case where the frequency f of the input signal (reference voltage) VREF lies in a frequency band lower than the gain-zero frequency fu (f<fu). It is therefore desired that the noise components are not added to the shield line as much as possible.

By way of illustration, it is desired that the reference voltage VREF generated by an internal voltage generating circuit and so forth are especially transmitted to each of driving circuits with stability. On the other hand, each driving circuit has a low degree of flexibility in arrangement with miniaturization of a semiconductor chip and highly integration of a configuration circuit. Therefore, there is a trend toward longer distance from the internal voltage generating circuit to the driving circuit. In such as a long distance wiring, the above-mentioned effect of noises in the shield line per se becomes more pronounced.

Now, the description will proceed to exemplary embodiments of this invention with reference to drawings.

Figure 6:
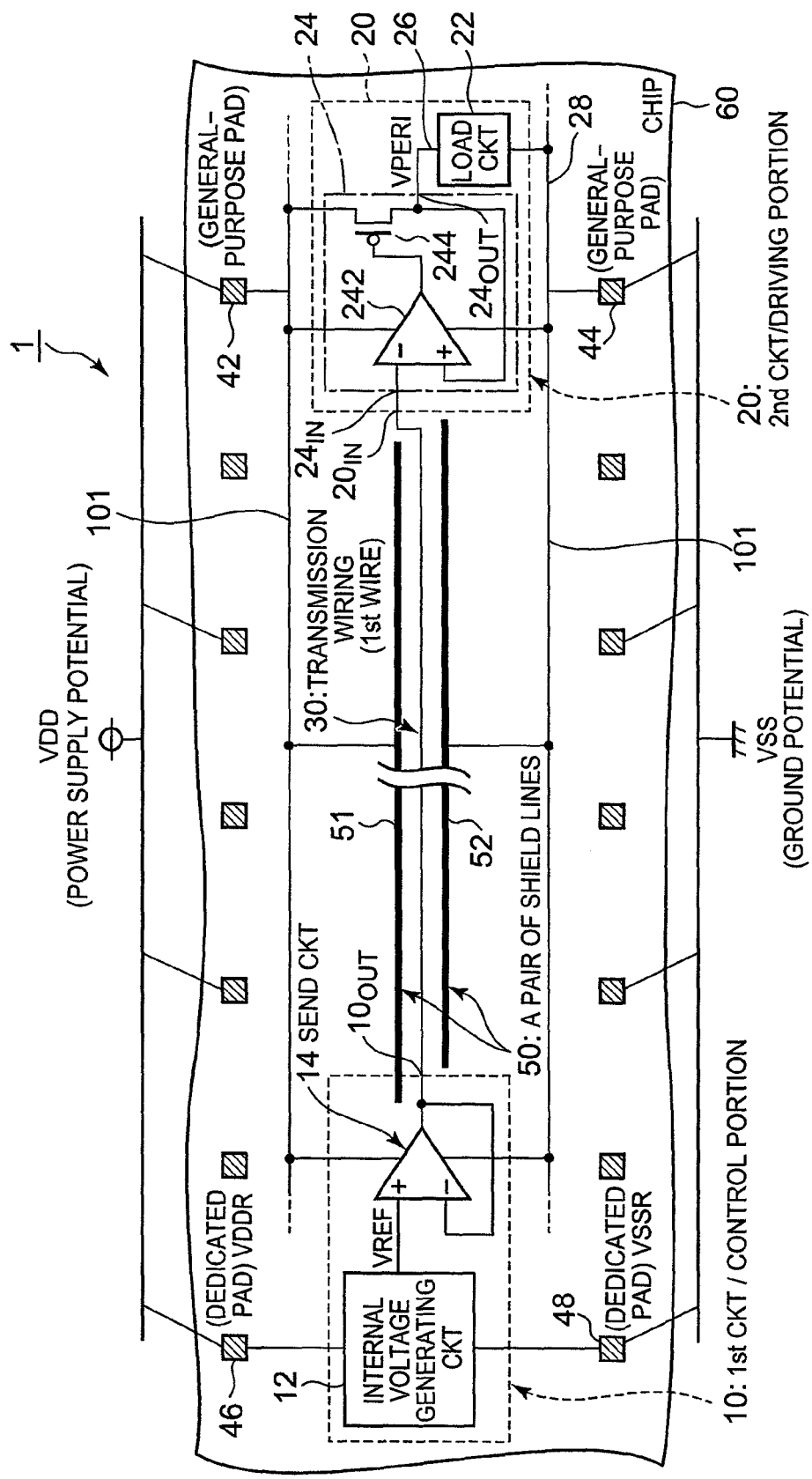
FIG. 6 a block diagram showing a semiconductor device according to a first exemplary embodiment of this invention.

Referring to FIG. 6, the description will proceed to a semiconductor device 1 according to a first exemplary embodiment of this invention.

The illustrated semiconductor device 1 comprises a first circuit 10 provided at a transmission side and a second circuit 20 provided at a reception side. The first circuit 10 has an output end $10_{OUT}$ while the second circuit 20 has an input end $20_{IN}$. The output end $10_{OUT}$ of the first circuit 10 and the input end $20_{IN}$ of the second circuit 20 are connected to each other via a transmission wire (a first wire) 30. In other words, the transmission wire 30 connects the output end $10_{OUT}$ of the first circuit 10 with the input end $20_{IN}$ of the second circuit 20.

The first circuit 10 includes an internal voltage generating circuit 12 for generating a reference voltage VREF. The reference voltage VREF is also called a predetermined voltage and the internal voltage generating circuit 12 is also called a voltage generating circuit. The first circuit 10 produces, at the output end $10_{OUT}$, the reference voltage (the predetermined voltage) VREF generated by the internal voltage generating circuit (the voltage generating circuit) 12.

The first circuit 10 may comprise a send circuit 14. The illustrated send circuit 14 comprises a voltage follower consisting of an operational amplifier. As well known in the art, the voltage follower carries out impedance conversion to produce a voltage equal to an input voltage supplied thereto as an output voltage thereof as-is. In other words, the voltage follower has an high-input/low-output impedance and a circuit for producing a voltage equal to the input voltage as it is. Such a voltage follower comprises an operational amplifier having a non-inverting terminal (+) as an input terminal and an output terminal which is directly fed bake to an inverting terminal (−) thereof. The send circuit 14 produces, on the transmission wire 30, the voltage equal to the reference voltage VREF generated by the internal voltage generating circuit 12 as an output voltage VREF as it is. In other words, the send circuit 14 controls a voltage of the output end $10_{OUT}$ of the first circuit 10 so as to make it equal to the predetermined voltage VREF.

More specifically, the operational amplifier constituting the send circuit 14 is supplied with a power supply potential VDD and a ground potential VSS. The non-inverting terminal (+) of the operational amplifier 14 is supplied with the reference voltage VREF. The inverting terminal (−) of the operational amplifier 14 is connected to the output terminal of the operational amplifier 14. The output terminal of the operational amplifier 14 is connected to the output end $10_{OUT}$ of the first circuit 10 in question.

The first circuit 10 is also referred to as a control portion. That is, the control portion 10 controls a voltage on the transmission wire 30 in accordance with the reference voltage VREF.

The second circuit 20 is also referred to as a driving portion because it operates on the basis of the voltage of the transmission wire 30. The second circuit 20 comprises a load circuit 22 and a load driving circuit 24.

Figure 7:
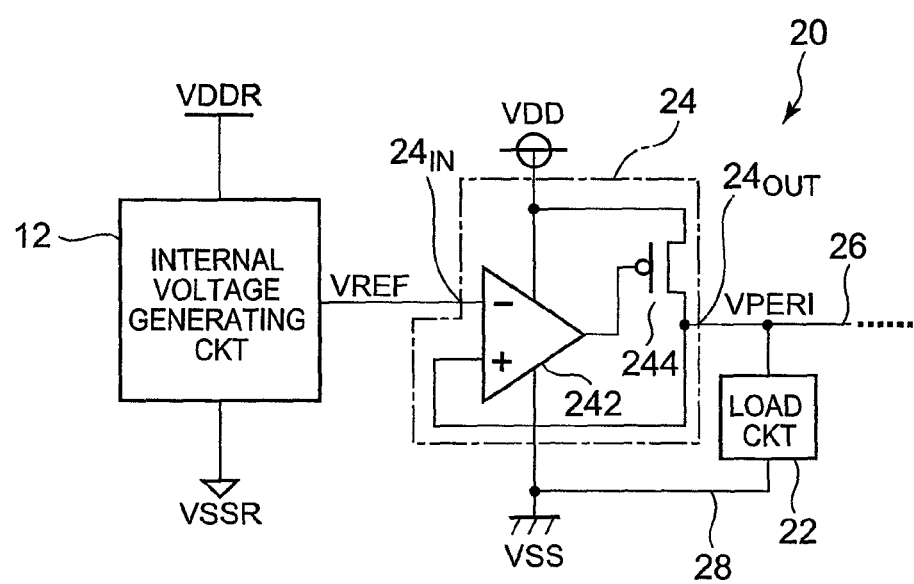
FIG. 7 a block diagram for use in describing structure of a load driving circuit used in the semiconductor device illustrated in FIG. 6 in detail.

Referring now to FIG. 7, the description will proceed to structure of the load driving circuit 24 in detail. In FIG. 7, the send circuit 14 and the transmission wire 30 illustrated in FIG. 6 are omitted.

The reference voltage VREF generated by the internal voltage generating circuit 12 is transmitted to various load driving circuits as like 24 via the transmission wire and is used to drive the load circuit 22.

The load driving circuit 24 has an input end $24_{IN}$ which is connected to the input end $20_{IN}$ of the driving portion 20 (see, FIG. 6). The load driving circuit 24 is a circuit for receiving, at the input end $24_{IN}$, the reference voltage VREF to drive the load circuit 22. The load driving circuit 24 comprises a comparison circuit (a control circuit) 242 composed of an operational amplifier and a p-channel MOSFET 244. The comparison circuit 242 is also called a regulator as describe above.

The comparison circuit 242 is supplied with the power supply potential VDD and the ground potential VSS. The comparison circuit 242 has an inverting terminal (−) supplied with the reference voltage VREF and a non-inverting terminal (+) supplied with an internal generated voltage VPERI. Accordingly, when the internal generated voltage VPERI is higher than the reference voltage VREF, a voltage level of an output signal of the comparison circuit 242 rises.

The comparison circuit 242 has an output terminal connected to a gate electrode (a control electrode) of the p-channel MOSFET (a first transistor) 244. The p-channel MOSFET 244 has a source electrode (a second main electrode) supplied with the power supply potential VDD. The p-channel MOSFET 244 has a drain electrode (a first main electrode) connected to the non-inverting terminal (+) of the comparison circuit 242. The drain electrode of the p-channel MOSFET 244 is connected to the output end $24_{OUT}$ of the load driving circuit 24 in question. The output end $24_{OUT}$ of the load driving circuit 24 is connected to an internal power supply line 26 supplied with the internal generated voltage VPERI.

In response to the output signal of the comparison circuit 242, the p-channel MOSFET 244 supplies a current from an external power supply node (a general-purpose pad) 42 to the internal power supply line 26. In other words, the comparison circuit 242 controls a voltage between the source electrode and the gate electrode of the p-channel MOSFET 242 so that a voltage (the internal generated voltage VPERI) of the drain electrode of the p-channel MOSFET 244 becomes the predetermined voltage. This operation will be later described in more detail.

When the internal generated voltage VPERI has a fixed voltage level (a level of the reference voltage VREF), the output signal of the comparison circuit 242 is put into a predetermined voltage level. In a case where the internal generated voltage VPERI is used because the load circuit 22 operates, a current flows from the internal power supply line 26 to the load circuit 22 and a voltage level of the internal generated voltage VPERI reduces. Inasmuch as the internal generated voltage VPERI is supplied to the non-inverting input terminal (+) of the comparison circuit 242, when the internal generated voltage VPERI reduces, the voltage level of the output signal of the comparison circuit 242 also reduces. Inasmuch as this output signal is a gate voltage of the p-channel MOSFET 244, the p-channel MOSFET 244 has an increased conductance in accordance with it, and the current flowing from the power supply potential VDD to the internal power supply line 26 increases. On the other hand, when a current flowing via the p-channel MOSFET 244 is more than the current consumed in the load circuit 22, the voltage level of the internal generated voltage VPERI rises. When the voltage level of the internal generated voltage VPERI rises and is higher than the reference voltage VREF, the voltage level of the output signal of the comparison circuit 242 rises and the p-channel MOSFET 244 has a low conductance. Therefore, an amount of the current flowing from the p-channel MOSFET 244 to the internal power supply line 26 reduces or is interrupted. That is, when the internal generated voltage VPERI is higher than the reference voltage VREF, the p-channel MOSFET 244 interrupts the current or reduces an amount of supply current. When the internal generated voltage VPERI is lower than the reference voltage VREF, the p-channel MOSFET 244 supplies much current from the power supply potential VDD to the internal power supply line 26. Thus, the internal generated voltage VPERI is maintained to the voltage level of the reference voltage VREF.

The load circuit 22 may be a circuit for operating by using the internal generated voltage VPERI as one operating power supply voltage, as shown in FIG. 1A. The load circuit 22 either may be a circuit for generating a fixed intermediate voltage (e.g. {(VPERI+VSS)/2}) on the basis of the internal generated voltage VPERI and the ground potential VSS or may be a circuit (e.g. a sense amplifier) for charging a predetermined signal line to the internal generated voltage VPERI. Under whatever circumstances, the load circuit 22 may be a circuit for operating by using the internal generated voltage VPERI on operation.

It is necessary that the power supply potential and the ground potential for driving the internal voltage generating circuit 12 are stable. It is therefore desired that wires for supplying the power supply potential and the ground potential to the internal voltage generating circuit 12 are connected to dedicated pads 46 and 48 which are different from wires for supplying a driving power supply to other circuits (see, FIG. 6). This is because, by connecting the wires for supplying the power supply potential or the ground potential to the dedicated pads 46 and 48, it is possible to decrease the effect of the noises on the power supply potential or the ground potential occurring in the other circuits. The power supply potential and the ground potential supplied from such as dedicated pads 46 and 48 indicate a stabilized power supply potential VDDR and a stabilized ground potential VSSR, respectively.

Turning back to FIG. 6, the power supply potential VDD is supplied from the general-purpose pad 42 while the ground potential VSS is supplied from the general-purpose pad 44. On the other hand, as described above, the stabilized power supply potential VDDR is supplied from the dedicated pad 46 near the transmission side while the stabilized ground potential VSSR is supplied from the dedicated pad 48 near the transmission side.

The semiconductor device 1 according to the first exemplary embodiment further comprises a pair of shield lines 50 disposed so as to sandwich the transmission wire 30 therebetween. Specifically, the pair of shield lines 50 comprises a first shield line 51 and a second shield line 52. The first shield line 51 is supplied with the power supply potential VDD via a power supply feeding wire 101 (see, FIG. 12B) from the general-purpose pad 42 while the second shield line 52 is supplied with the ground potential VSS via a power supply feeding wire 101 from the general-purpose pod 44.

In the manner which is described above, the second circuit (the driving portion) 20 is supplied with the power supply potential VDD via the general-purpose pad 42 and with the ground potential VSS via the general-purpose pad 44. Accordingly, in the pair of shield lines 50, one (e.g. the first shield line 51) is supplied with the power supply potential VDD for driving the second circuit 20 while another (e.g. the second shield line 52) is supplied with the ground potential VSS for driving the second circuit 20.

Although the first shield line 51 is supplied with the power supply potential VDD in the first exemplary embodiment, the shield line 51 may be supplied with the stabilized power supply potential VDDR for driving the voltage generating circuit 12 as shown in other exemplary embodiments and modified examples which will be later described. Likewise, although the second shield line 52 is supplied with the ground potential VDD in the first exemplary embodiment, the second shield line 52 may be supplied with the stabilized ground potential VDDR as shown in the other exemplary embodiments and the modified examples which will be later described.

In the manner which will be later described in detail, the pair of shield lines 50 is disposed via an insulating film 90 (which will be later described) along the transmission wire 30. In the first exemplary embodiment, in the pair of shield lines 50, one (e.g. the first shield line 51) is fixed by the power supply potential VDD supplied to the second circuit 20 while another (e.g. the second shield line 52) is fixed by the ground potential VSS supplied to the second circuit 20.

As described above, the first shield line 51 may be fixed by the stabilized power supply potential VDDR supplied to the voltage generating circuit 12 while the second shield line 51 may be fixed by the stabilized ground potential VSSR supplied to the voltage generating circuit 12.

The illustrated semiconductor device 1 is formed on a semiconductor chip (which will be later called a "chip" briefly) 60.

Specifically, the semiconductor device (1) according to the first exemplary embodiment comprises the first circuit (10) including the voltage generating circuit (12) for generating the predetermined voltage (VFER) and producing the predetermined voltage (VFER) at the output end (10$_{OUT}$) thereof, the second circuit (20) having an input end (20$_{IN}$), and the transmission wire (30) for connecting the output end (10$_{OUT}$) of the first circuit (10) with the input end (20$_{IN}$) of the second circuit (20), and the pair of shield lines (50) disposed so as to sandwich the transmission wire (30) therebetween, wherein one (51) of the pair of shield lines is supplied with the power supply potential (VDD; VDDR) for driving at least one of the voltage generating circuit (12) and the second circuit (20), and another (52) thereof is supplied with the ground potential (VSS; VSSR) for driving at least one of the voltage generating circuit (12) and the second circuit (20).

In other words, the semiconductor device (1) according to the first exemplary embodiment comprises the control portion (10) including the voltage generating circuit (12) and controlling the voltage (VFER) of the transmission wire (30) in accordance with the predetermined voltage (VREF), the driving portion (20) operating by the voltage (VREF) of the transmission wire (30), and the pair of shield lines (50) disposed via the insulating film (90) along the transmission wire (30), wherein one (51) of the pair of shield lines (50) is fixed by the power supply potential (VDD; VDDR) which is supplied to at least one of the voltage generating circuit (12) and the driving portion (20) and another (52) thereof is fixed by the ground potential (VSS; VSSR) which is supplied to at least one of the voltage generating circuit (12) and the driving portion (20).

Figure 8:
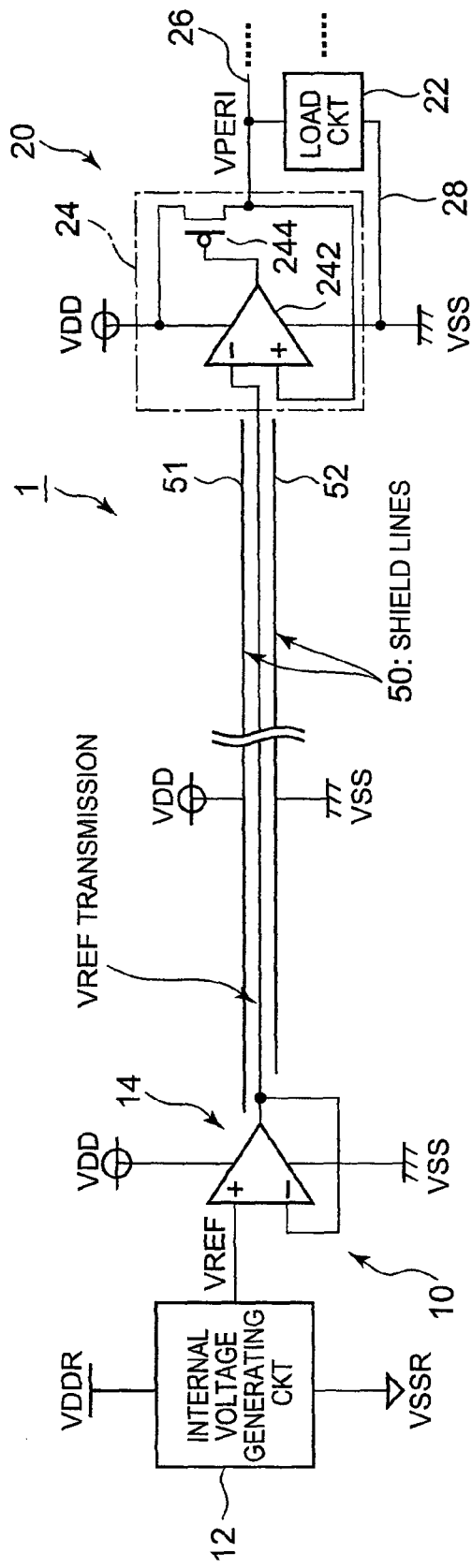
FIG. 8 is a block diagram showing, in the semiconductor device illustrated in FIG. 6, a state where the predetermined voltage (the reference voltage) VREF sent from a send circuit of a first circuit (a control portion) is transmitted to a load driving circuit of a second circuit (a driving portion)

In the semiconductor device 1 having such structure, the predetermined voltage (the reference voltage) VREF sent from the send circuit 14 of the first circuit (the control portion) 10 is transmitted to the load driving circuit 24 of the second circuit (the driving portion) 20, as shown in FIG. 8.

That is, in a case where a distance from the internal voltage generating circuit 12 to the load driving circuit 24 is way far apart, the reference voltage VREF is impedance converted by the send circuit (a transmission side voltage follower) 14 before it is transmitted.

Figure 9:
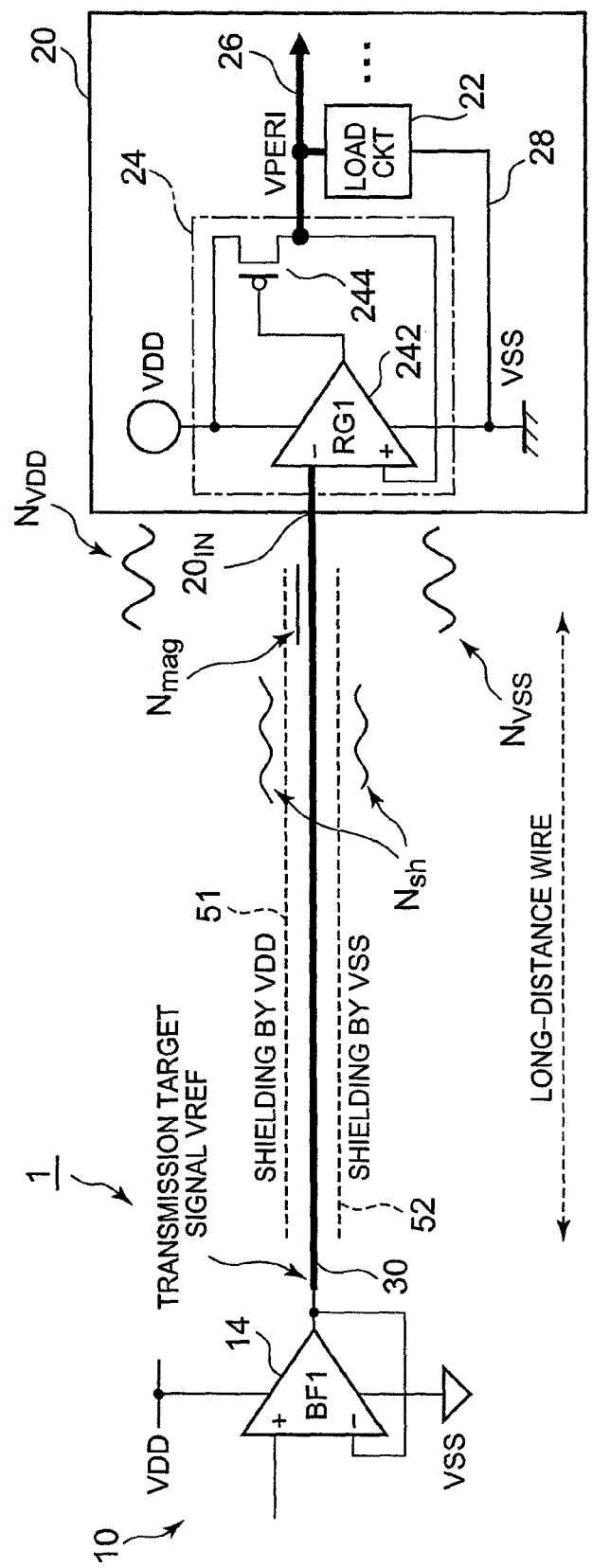
FIG. 9 is a block diagram showing the semiconductor device according to the first exemplary embodiment, for use in describing an operation-effect of the semiconductor device illustrated in FIG. 6, with an internal voltage generating circuit omitted.
Figure 10:
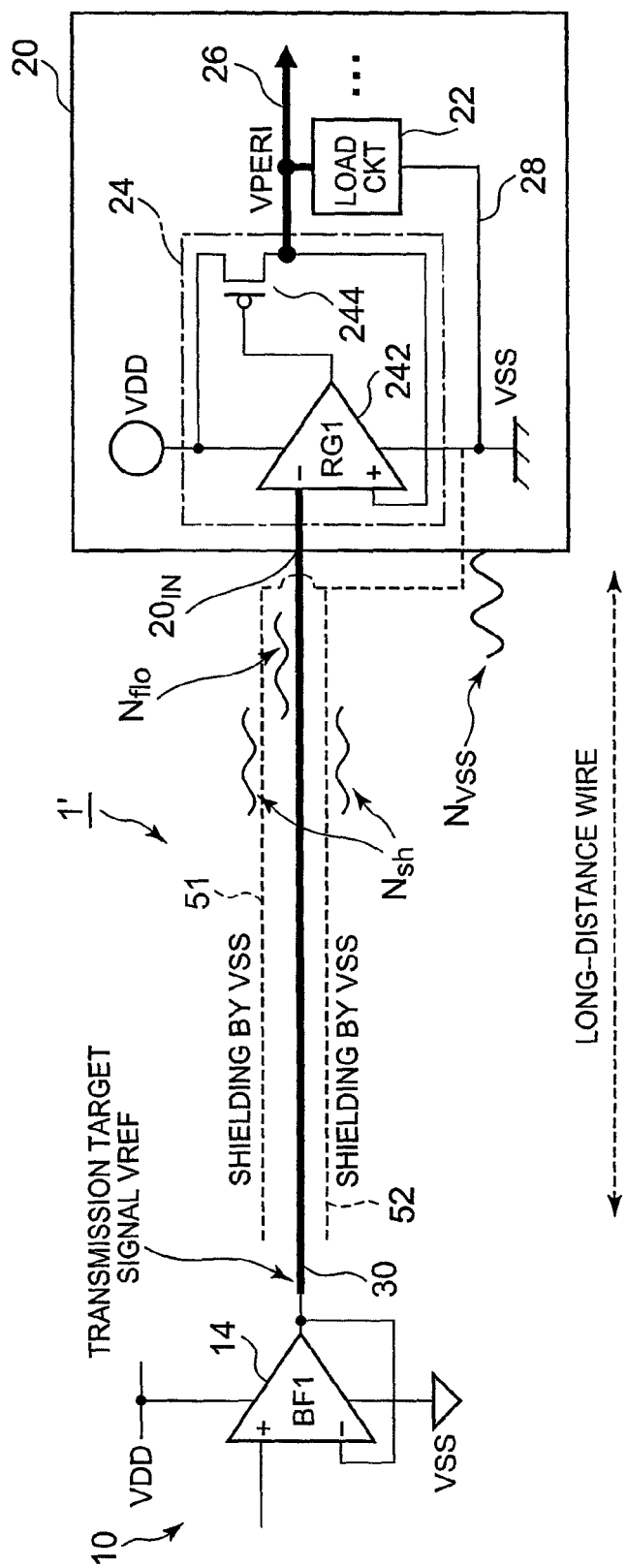
FIG. 10 is a block diagram showing a related semiconductor device, for use in describing an operation-effect of the semiconductor device illustrated in FIG. 6, with the internal voltage generating circuit omitted.

Referring now to FIGS. 9 and 10, the description will proceed to an operation-effect of the semiconductor device 1 according to the first exemplary embodiment in contradistinction to a related semiconductor device 1'. FIG. 9 is a block diagram showing the semiconductor device 1 according to the first exemplary embodiment while FIG. 10 is a block diagram showing the related semiconductor device 1'. But, in both of FIGS. 9 and 10, illustration of the internal voltage generating circuit 12 provided in the first circuit (the control portion) 10 is omitted.

First, referring to FIG. 10, description will be made as regards a problem of the related semiconductor device 1'. In the related semiconductor device 1', both of the pair of shield lines 50 (51, 52) for shielding the transmission wire 30 are supplied with the ground potential VSS.

In a case where the pair of shield lines 50 is shielded in a long-distance by the ground potential VSS in this manner, a noise margin for the power supply potential VDD decreases due to shield noise components $N_{sh}$ superimposed on the pair of shield lines 50. This is because a VSS noise component $N_{VSS}$ is in opposite phase to the power supply potential VDD. As a result, a flouting $N_{flo}$ of the ground potential VSS at the instant when the load driving circuit 24 drives the load circuit 22 is superimposed to the reference voltage VREF as the noise component $N_{VSS}$.

Referring to FIG. 9, in the semiconductor device 1 according to the first exemplary embodiment, in the pair of shield lines 50 for shielding the transmission wire 30, one (the first shield line) 51 is supplied with the power supply potential VDD while another (the second shield line) 52 is supplied with the ground potential VSS.

In a case where a long-distance shield is made so that the one (the first shield line) 51 of the pair of shield lines 50 is shielded by using the power supply potential VDD while the other (the second shield line) 52 thereof is shielded by using the ground potential VSS in this manner, the shield noise components $N_{sh}$ are superimposed on the pair of shield lines 50. The VSS noise component $N_{VSS}$ is in opposite phase to the power supply potential VDD while a VDD noise component $N_{VDD}$ is in opposite phase to the ground potential VSS. Therefore, the VSS noise component $N_{VSS}$ and the VDD noise component $N_{VDD}$ are in opposite phases each other to cancel them, it is possible to ensure the noise margin $N_{mag}$ from both of the power supply potential VDD and the ground potential VSS.

Figure 11:
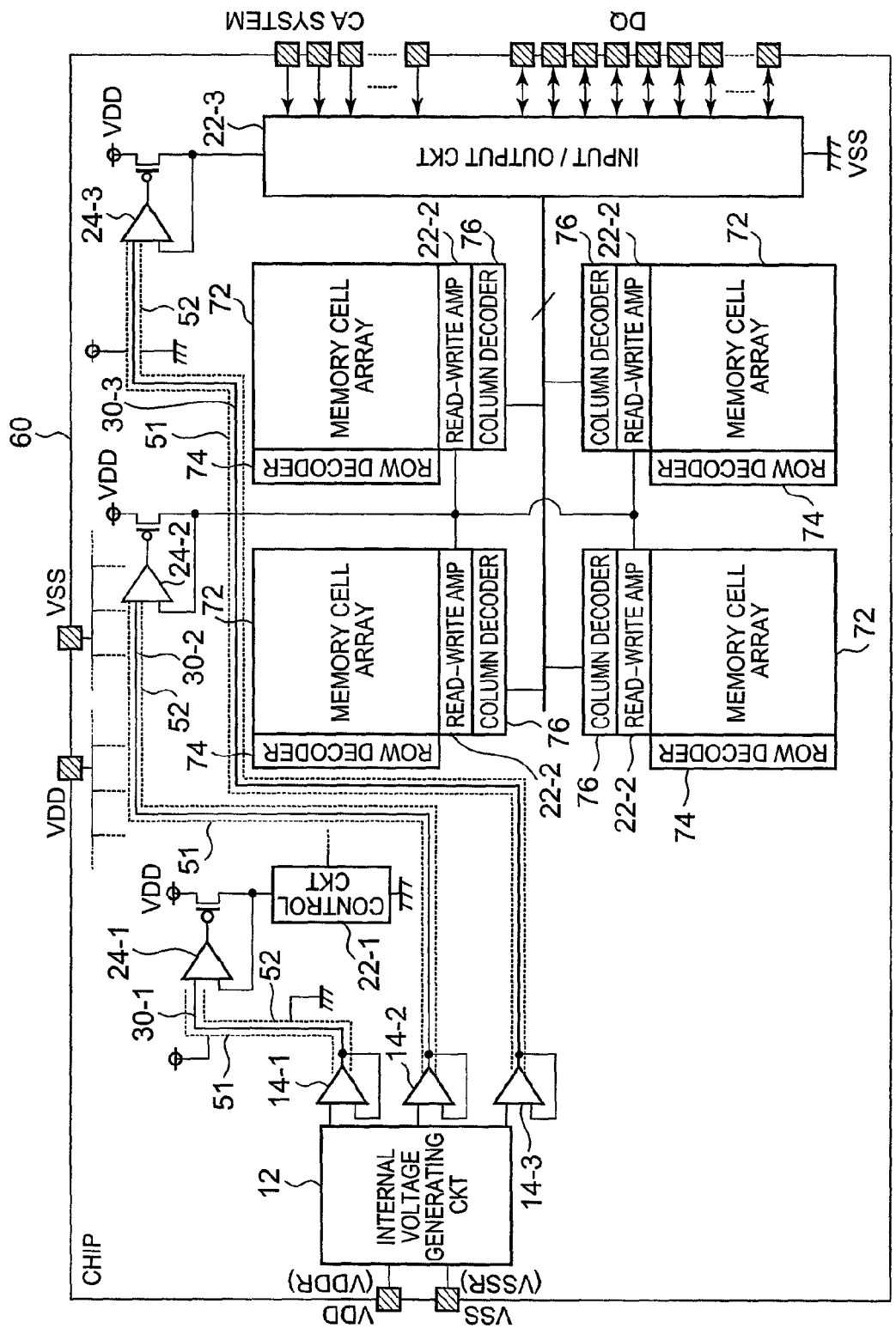
FIG. 11 is a block diagram showing an overview of a dynamic random access memory (DRAM) on a chip that is a concrete example of the semiconductor device illustrated in FIG. 6.

FIG. 11 is a block diagram showing an overview of a dynamic random access memory (DRAM) on the chip 60 that is a concrete example of the semiconductor device 1 illustrated in FIG. 6.

In the illustrated DRAM, the internal voltage generating circuit 12 is connected to first through third send circuits 14-1, 14-2, and 14-3.

The first send circuit 14-1 has an output end connected to an input end of a first load driving circuit 24-1 via a first transmission wire 30-1. The first transmission wire 30 is shielded by a pair of shield lines (51, 52) wherein the one shield line 51 is supplied with the power supply potential VDD while the other shield line 52 is supplied with the ground potential VSS. The first load driving circuit 24-1 drives a control circuit serving as a first load circuit 22-1. The control circuit 22-1 is a circuit for controlling operation of the DRAM collectively.

The illustrated DRAM includes four memory cell arrays 72. Each memory cell array 72 is one where a lot of memory cells each storing one bit are disposed in a matrix fashion in a row direction and in a column direction. An address signal supplied from the outside designates a row address or a column address for an access target of the memory cell array 72.

Each memory cell array 72 is connected to a row decoder 74 and is connected to a column decoder 76 via read-write amplifiers 22-2. The row decoder 74 selects one word line corresponding to the row address designated by the address signal and activates the read-write amplifiers 22-2 which are disposed at column sides. On the other hand, the column decoder 76 selects one bit line (date line) corresponding to the column address designated by the address signal.

The second send circuit 14-2 has an output end connected to an input end of a second load driving circuit 24-2 via a second transmission wire 30-2. The second transmission wire 30-2 is shielded by a pair of shield wires (51, 52) wherein the one shield wire 51 is supplied with the power supply potential VDD while the other shield wire 52 is supplied with the ground potential VSS. The second load driving circuit 24-2 drives the read-write amplifiers 22-2. The read-write amplifiers 22-2 serve as a second load circuit.

The third send circuit 14-3 has an output end connected to an input end of a third load driving circuit 24-3 via a third transmission wire 30-3. The third transmission wire 30-3 is shielded by a pair of shield wires (51, 52) wherein the one shield wire 51 is supplied with the power supply potential VDD while the other shield wire 52 is supplied with the ground potential VSS. The third load driving circuit 24-3 drives an input/output circuit serving as a third load circuit 22-3. The input/output circuit 22-3 is a circuit for inputting/outputting the address signal and data between the column decoder 76 and input/output terminals.

In the manner which is described above, with a large storage capacity and higher performance of the memory (DRAM), the tendency is toward becoming longer in length of the transmission wires.

Figures 12A, 12B:
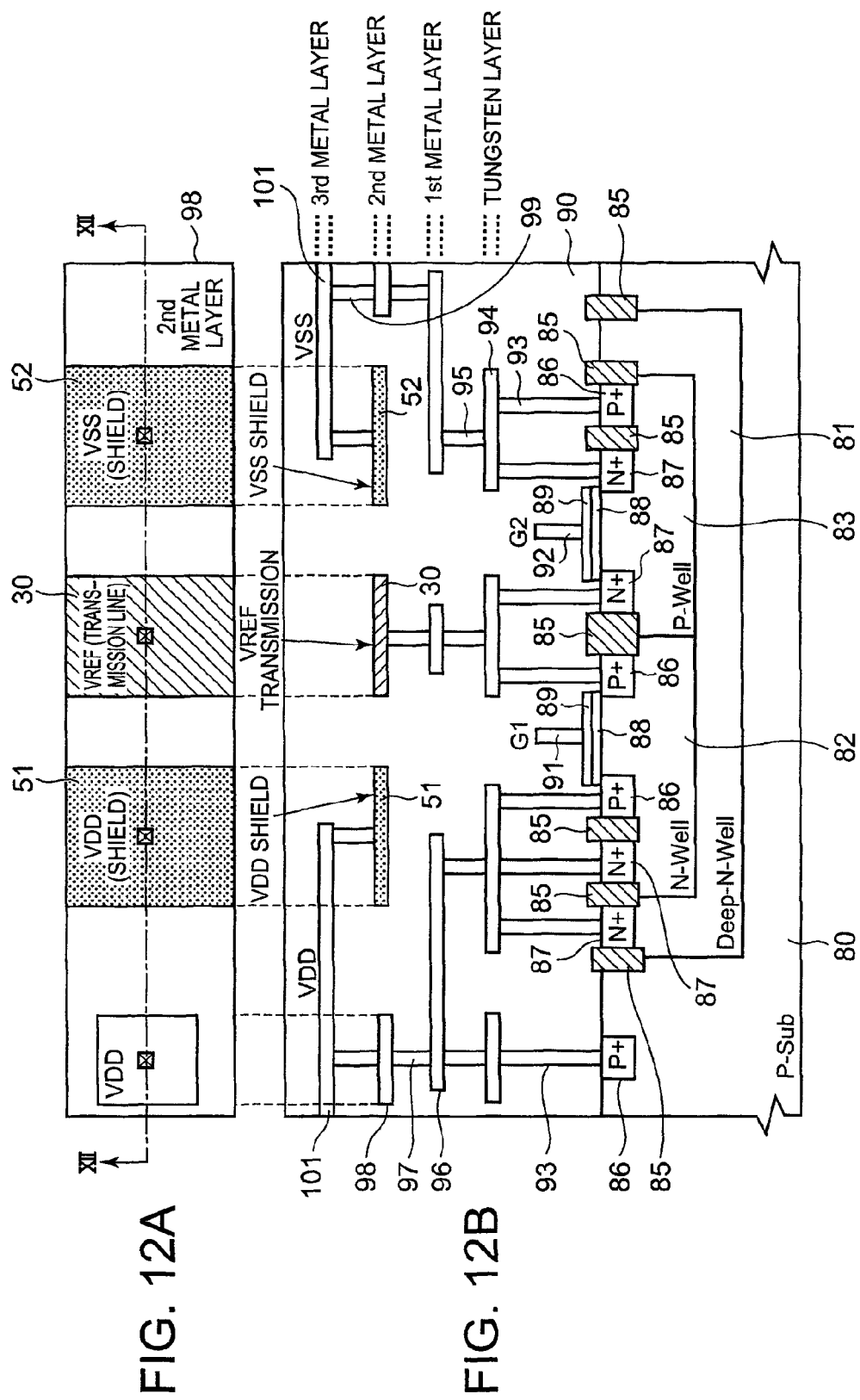
FIG. 12A is a transverse sectional view showing structure of an output portion of the send circuit (a send side voltage follower) in the semiconductor device illustrated in FIG. 6.
FIG. 12B is a vertical sectional view taken on line XII-XII of FIG. 12A.

Referring to FIGS. 12A and 12B, description will be made as regards a cross-sectional structure of an output portion of the send circuit (the transmission side voltage follower) 14 in the semiconductor device 1 illustrated in FIG. 6. FIG. 12A is a transverse sectional view showing structure of the output portion of the send circuit (the send side voltage follower) 14. FIG. 12B is a vertical sectional view taken on line XII-XII of FIG. 12A. FIG. 12A is the transverse sectional view taken on a second metal layer of FIG. 12B.

As shown in FIG. 12B, in the output portion of the send circuit (the transmission side voltage follower) 14, a P-channel MOSFET and an N-channel MOSFET are formed. In FIG. 12B, the P-channel MOSFET is formed at left side toward a paper surface while the N-channel MOSFET is formed at right side toward the paper surface.

More specifically, in a P-type substrate 80, a deep-N-well layer 81 is formed. In the vicinity of a main surface of the P-type substrate 80, a boundary between the P-type substrate 80 and the deep-N-well layer 81 is separated by an element separation layer 85. In the deep-N-well layer 81, an N-well layer 82 and a P-well layer 83 are formed. In the example being illustrated, the N-well layer 82 is formed at left side toward the paper surface while the P-well layer 83 is formed at right side toward the paper surface. In the vicinity of a surface in parallel with the main surface of the P-type substrate 80, a boundary between the deep-N-well layer 81 and the N-well layer 82 is separated by an element separation layer 85 while a boundary between the deep-N-well layer 81 and the P-well layer 83 is separated by an element separation layer 85. Furthermore, in the vicinity of the surface in parallel with the main surface of the P-type substrate 80, a boundary between the N-well layer 82 and the p-well layer 83 is also separated by an element separation layer 85.

In the vicinity of the main surface of the P-type substrate 80 at left side, a P+ layer 86 is formed. In the vicinity of a main surface of the deep-N-well layer 81 at left side, an N+ layer 87 is formed between the element separation layers 85. In the vicinity of a main surface of the N-well layer 82 at left side, an element separation layer 85, an N+ layer 87, an element separation layer 85, and a P+ layer 86 are formed in this turn from a left edge thereof. On the other hand, in the vicinity of a main surface of the N-well layer 82 at right side, a P+ layer 86 is formed adjacent to the element separation layer 85. Between the pair of P+ layers 86 formed in the vicinity of the main surface of the N-well layer 82, a P-type channel is formed. On the P-type channel, a poly-metal layer 89 is formed via a gate oxidization layer 88. On the poly-metal layer 89, a first gate (G1) 91 is formed.

Thus, on the N-well layer 82, the P-channel MOSFET is formed which has the first gate (G1) 91, a source as the P+ layer 86 located at left side of the first gate (G1) 91, and a drain as the P+ layer 86 located at right side thereof.

In the vicinity of a main surface of the P-well layer 83 at right side, an element separation layer 85, a P+ layer 86, an element separation layer 85, and an N+ layer 87 are formed in this turn from a right edge thereof. On the other hand, in the vicinity of the main surface of the P-well layer 83 at left side, an N+ layer 87 is formed adjacent to the element separation layer 85. Between the pair of N+ layers 87 formed in the vicinity of the main surface of the P-well layer 83, an N-type channel is formed. On the N-type channel, a poly-metal layer 89 is formed via a gate oxidization layer 88. On the poly-metal layer 89, a second gate (G2) 92 is formed.

Thus, on the P-well layer 83, the N-channel MOSFET is formed which has the second gate (G2) 92, a source as the N+ layer 87 located at right side of the second gate (G2) 92, and a drain as the N+ layer 87 located at left side thereof.

On the main surface of the P-type substrate 80, the insulating film 90 is formed. In the insulating film 90, a tungsten layer 94 is formed which is connected to the P+ layers 86 and the N+ layers 87 via first through holes 93. In addition, in the insulating film 90, a first metal layer 96 is formed which is connected to the tungsten layer 94 via second through holes 95. In the insulating film 90, a second metal layer 98 is formed which is connected to the first metal layer 96 via third through holes 97. Furthermore, in the insulating film 90, a third metal layer 101 is formed which is connected to the second metal layer 98 via fourth through holes 99.

As apparent from FIG. 12B, in the second metal layer 98, the transmission wire 30 for transmitting the reference voltage VREF, the first shield line 51, and the second shield line 52 are formed.

The transmission wire 30 is connected to the drain (the P+ layer 86) of the P-channel MOSFET and to the drain (the N+ layer 87) of the N-channel MOSFET via the third though hole 97, the first metal layer 96, the second through hole 95, the tungsten layer 94, and the first through holes 93. At any rate, the reference voltage VREF produced by the send circuit 14 is transmitted via the transmission wire 30 formed in the second metal layer 98.

In FIG. 12B, the first shield line 51 is formed at left side in the second metal layer 98 while the second shield line 52 is formed at right side therein. The first shield line 51 is supplied with the power supply potential VDD from the third metal layer 101. In addition, the second shield line 52 is supplied with the ground potential VSS from the third metal layer 101. Accordingly, the third metal layer 101 is used as the power supply feeding wire, the first shield line 51 is fixed by the power supply potential VDD, and the second shield line 52 is fixed by the ground potential VSS.

To the P+ layer 86 formed in the vicinity of the main surface of the P-type substrate 80, the power supply potential VDD is supplied from the third metal layer 101 via the fourth through hole 99, the second metal layer 98, the third through hole 97, the first metal layer 96, the second through hole 95, the tungsten layer 94, and the first through hole 93.

Likewise, to the N+ layer 87 formed in the vicinity of the main surface of the deep-N-well layer 81, to the N+ layer 87 formed in the vicinity of the main surface of the N-well layer 82, and to the P+ layer 86 (the source) formed in the vicinity of the main surface of the N-well layer 82, the power supply potential VDD is supplied from the third metal layer 101 via the fourth through hole 99, the second metal layer 98, the third through hole 97, the first metal layer 96, the second through hole 95, the tungsten layer 94, and the first through holes 93.

On the other hand, to the P+ layer 86 and the N+ layer 87 (the source) which are formed in the vicinity of the main surface of the P-well layer 83, the ground potential VSS is supplied from the third metal layer 101 via the fourth through hole 99, the second metal layer 98, the third though hole 97, the first metal layer 96, the second through hole 95, the tungsten layer 94, and the first through holes 93.

Now, the description will proceed to a special technical feature (STF) of the semiconductor device 1 according to the first exemplary embodiment of this invention.

In the manner which is described above, in the semiconductor device 1 according to the first exemplary embodiment of this invention, at both sides of transmission wire 30, the pair of shield lines 30 wherein the one (the first shield line) 51 is fixed by the power supply potential VDD and the other (the second shield line) 51 is fixed by the ground potential VSS is disposed so as to sandwich the transmission wire 30 therebetween. Specifically, the power supply potential VDD and the ground potential VSS for fixing those shield lines are the power supply voltage VDD and the ground potential VSS which drive the load driving circuit 24 (the second circuit 20), respectively.

Or to put it another way, the semiconductor device 1 according to the first exemplary embodiment of this invention comprises the first circuit 10 including the voltage generating circuit 12 for generating the predetermined voltage BREF and producing the predetermined voltage VREF at the output end $10_{OUT}$ thereof, the second circuit 20 having the input end $20_{IN}$, the transmission wire 30 for connecting the output end $10_{OUT}$ of the first circuit 10 to the input end $20_{IN}$ of the second circuit 20, and the pair of shield lines 30 disposed so as to sandwich the transmission wire 30 therebetween, wherein the one 51 is supplied with the power supply potential VDD for driving the second circuit 20 and the other 52 is supplied with the ground potential VSS for driving the second circuit 20.

In other words, the semiconductor device 1 according to the first exemplary embodiment of this invention comprises the control portion 10 including the voltage generating circuit 12 for generating the predetermined voltage VREF and controlling the voltage of the transmission wire 30 in accordance with the predetermined voltage VREF, the driving portion 20 operating by the voltage of the transmission wire 30, and the pair of shield lines 50 disposed via the insulating file 90 along the transmission wire 30, wherein the one 51 is fixed by the power supply potential VDD supplied to the driving portion 20 and the other 52 is fixed by the ground potential VSS supplied to the driving portion 20.

By the above-mentioned feature, it is possible to decrease the effect of the noises against the transmission wire 30. The description will be made as regards the ground thereof in detail.

To provide the shield lines fixed to the ground potential VSS (or the power supply potential VDD) along the transmission wire 30 per se (see, FIG. 10) is effective at reducing the noises from circuits disposed on the periphery of the wires and coupling noises from adjacent wires. However, in the related semiconductor device 1', there is apprehension that noises occur in the ground potential VSS (or the power supply potential VDD) per se.

Now, the description will proceed to a mechanism where the noises occur in the ground potential VSS (or the power supply potential VDD) per se.

In the manner as described in conjunction with FIGS. 1B and 2, at the location 1 of FIG. 2, the internal generated voltage VPERI on the internal power supply line 26 temporarily drops due to the flow-through current I0 and the charging current I2. Similarly, at the location 2 of FIG. 2, the ground potential VSS on the grounding line 28 temporarily rises due to the flow-through current I0 and the discharge current I1. The drop of the internal generated voltage VPERI and rise of the ground potential VSS cause the noises to the power supply wires (the internal power supply line 26 and the grounding line 28).

Accordingly, in the shielding method (FIG. 10) for fixing the shield lines disposed around the transmission wire 30 to the ground potential VSS alone (or to the power supply potential VDD), it is impossible to reduce the noises occurring in their fixed potential per se.

For this reason, in the semiconductor device 1 according to the first exemplary embodiment of this invention, in the pair of shield lines 50 disposed both sides of transmission wire 30, the one (the first shield line) 51 is fixed by the power supply potential VDD and the other (the second shield line) 52 is fixed by the ground potential VSS. Particularly, the pair of shield lines 50 is fixed by the power supply potential VDD and the ground potential VSS which drive the load driving circuit 24 serving as a source generating the noises. On driving the load driving circuit 24, the noises occurring in the power supply potential VDD and the ground potential VSS are in opposite phase each other.

Referring now to FIGS. 1B and 2 again, the description will proceed to the grounds where the VDD noise $N_{VDD}$ (see, FIG. 9) and the VSS noise $N_{VSS}$ (see, FIG. 9) are in opposite phase each other.

As shown in FIG. 1B, the flow-through current I0, the discharge current I1, and the charging current I2 flow from the internal power supply line 26 supplied with the internal generated voltage VPERI to the grounding line 28 supplied with the ground potential VSS. Thus, the internal generated voltage VPERI and the ground potential VSS cause the noises in opposite phase each other, as shown in FIG. 2.

Accordingly, for example, in a case where the noises occur in the ground potential VSS fixing one shield line (the second shield line) 52, noises in opposite phase occur in the power supply potential VDD fixing another shield line (the first shield line) 51 and therefore the coupling noises superimposed to the transmission wire 30 cancel to each other. If the power supply potential and the ground potential which drive circuits different from each other are supplied, it has no effect thereon because they do not cause the noises in opposite phase. In the manner which is described above, according to this structure, it is possible not only to reduce the noises from peripheral circuits for the transmission wire 30 or adjacent wires but also to reduce the coupling noises arising from the noises occurring in the shield lines 50 per se.

Figure 13:
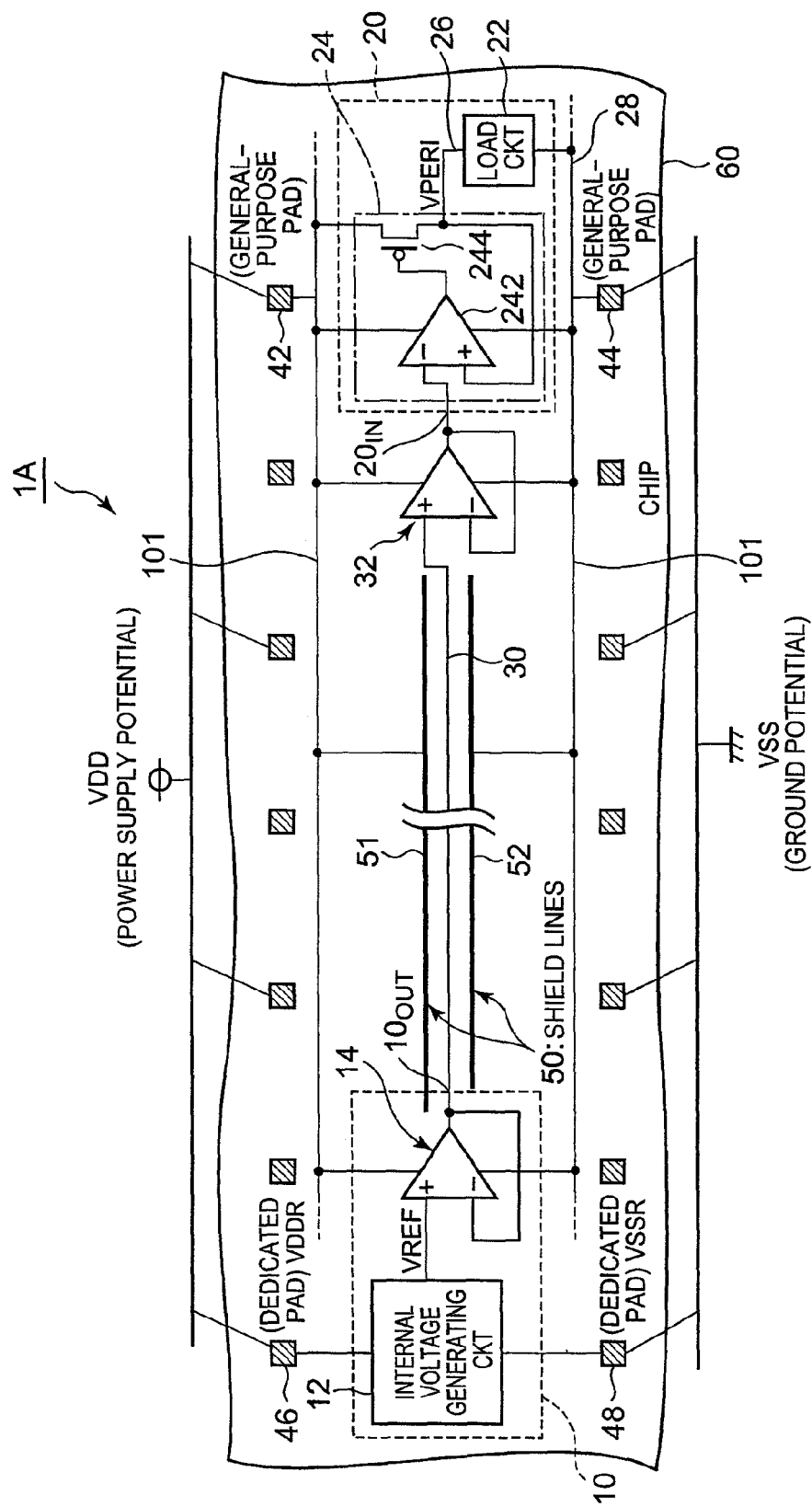
FIG. 13 is a block diagram showing a semiconductor device according to a second exemplary embodiment of this invention.

Referring to FIG. 13, the description will proceed to a semiconductor device 1A according to a second exemplary embodiment of this invention.

The illustrated semiconductor device 1A is similar in structure to the semiconductor device 1 illustrated in FIG. 6 except that the semiconductor device 1A further comprises a receive circuit (a reception side voltage follower) 32 at the reception side. The same reference symbols are depicted to those having functions similar to components illustrated in FIG. 6 and the description will later proceed to the dissimilarities alone for the sake of simplification of the description.

The illustrated receive circuit 32 operates at the power supply potential VDD and the ground potential VSS which are similar to those of the send circuit 14 disposed in the transmission side. The voltage of the transmission wire 30 is supplied to the second circuit (the driving portion) 20 through the receive circuit 32.

The receive circuit 32 is similar in structure to the send circuit 14 disposed in the transmission side. The illustrated receive circuit 32 comprises a voltage follower composed of an operational amplifier. In the manner which is known in this technical field, the voltage follower converts impedance to produce, as an output voltage thereof, a voltage equal to an input voltage supplied thereto at it is. That is, the voltage follower has an high-input/low-output impedance and a circuit for producing the voltage equal to the input voltage as it is. Accordingly, the receive circuit 32 has a high input impedance and sends to the second circuit (the driving portion) 20 the voltage equal to the reference voltage (the predetermined voltage) VREF of the transmission wire 30 as the output voltage VREF as it is. In other words, the receive circuit 32 is a circuit for controlling a voltage of the input end $20_{IN}$ of the second circuit 20 so as to become equal to the predetermined voltage VREF of the transmission wire 30.

More specifically, the operational amplifier composed of the receive circuit 32 is supplied with the power supply potential VDD via the general-purpose pad 42 and with the ground potential VSS via the general-purpose pad 44. The operational amplifier 32 has a non-inverting input terminal (+) supplied with the reference voltage (the predetermined voltage) VREF of the transmission wire 30. The operational amplifier 32 has an inverting input terminal (−) connected to an output terminal of the operational amplifier 32. The output terminal of the operational amplifier 32 is connected to the input end $20_{IN}$ of the second circuit 20.

With this structure, although in-phase noises occur in the signal of the transmission wire 30 caused by the long-distance wire 30, a difference of the input potential of the receive circuit 32 does not change because all of the power supply potential VDD, the ground potential VSS, and the reference voltage VREF are in phase with each other. Accordingly, it has little effect on the output of the receive circuit 20.

Now, description will be made as regards a special technical feature of the semiconductor device 1A according to the second exemplary embodiment of this invention.

In the manner which is described above, in the semiconductor device 1A according to the second exemplary embodiment of this invention, at both sides of the transmission wire 30, the pair of shield wires 50 in which the one (the first shield wire) 51 is fixed by the power supply potential VDD and the other (the second shield wire) 52 is fixed by the ground potential VSS is disposed so as to sandwich the transmission wire 30 therebetween. In particular, the power supply potential VDD and the ground potential VSS for fixing their shield lines are the power supply potential VDD and the ground potential VSS which drive the load driving circuit 24 (the second circuit 20), respectively.

That is, the semiconductor device 1A according to the second exemplary embodiment of this invention has the special technical feature (STF) which is similar to that of the semiconductor device 1 according to the above-mentioned first exemplary embodiment, as shown in FIG. 6.

By the above-mentioned feature, it is possible to decrease the effect of the noises for the transmission wire 30.

Figure 14:
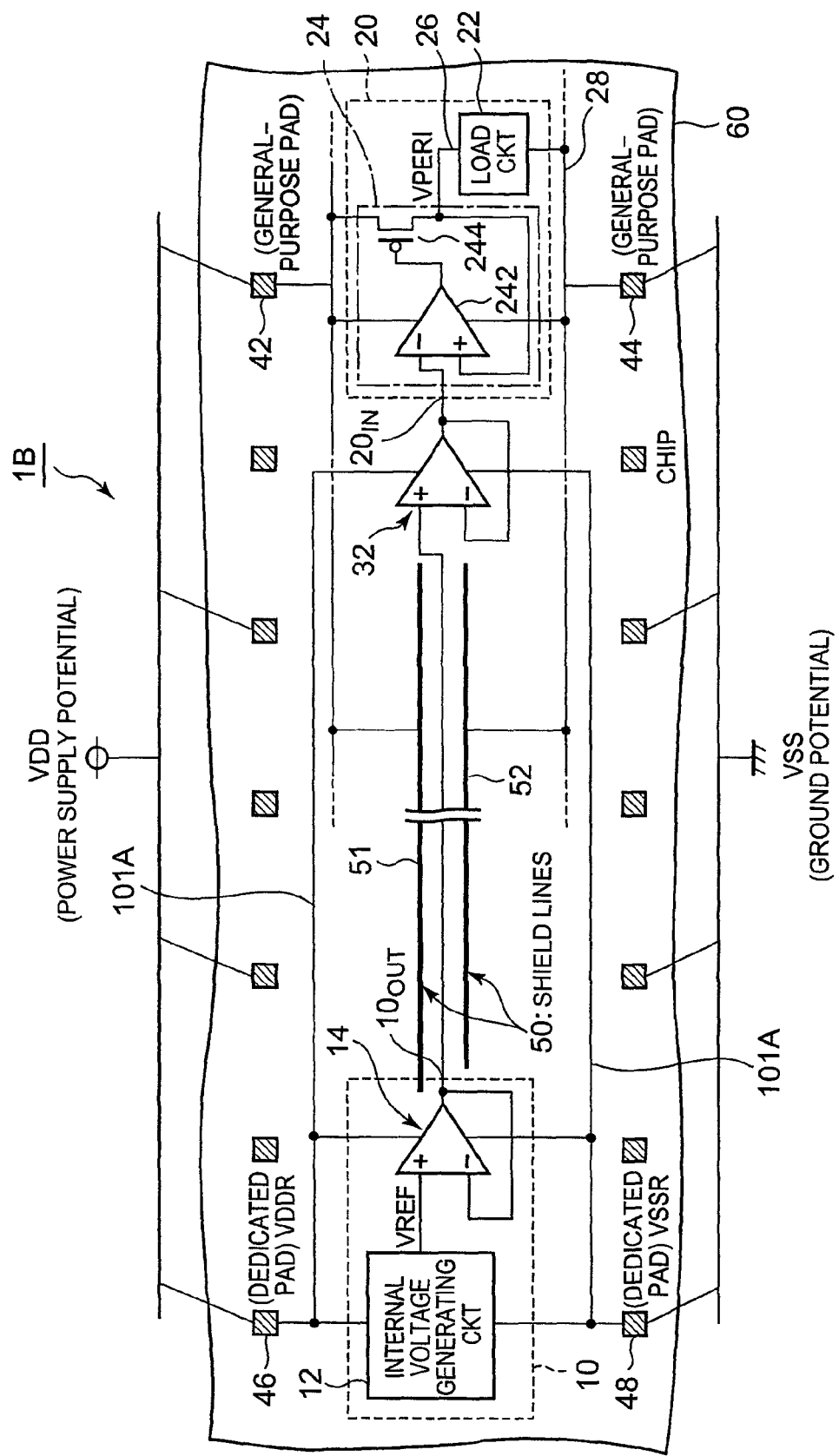
FIG. 14 is a block diagram showing a semiconductor device according to a first modified example of the second exemplary embodiment of this invention.

Referring to FIG. 14, the description will proceed to a semiconductor device 1B according to a first modified example of the second exemplary embodiment of this invention.

The illustrated semiconductor device 1B is similar in structure to the semiconductor device 1A illustrated in FIG. 13 except that a way of feeding to the send circuit 14 and the receive circuit 32 is different from in the manner which will be described later. The same reference symbols are depicted to those having functions similar to components illustrated in FIG. 13 and the description will later proceed to the dissimilarities alone for the sake of simplification of the description.

A power supply for driving the send circuit (the transmission side voltage follower) supplies from the dedicated pads 46 and 48 in vicinity to the transmission side. More specifically, the send circuit (the transmission side voltage follower) 14 is supplied with the stabilized power supply potential VDDR via the dedicated pad 46 in vicinity to the transmission side and with the stabilized ground potential VSSR via the dedicated pad 48 in vicinity to the transmission side. By adopting such a structure, it is possible to reduce noises occurring in the signal (e.g. transmission target signal) VREF per se that is produced by the send circuit (the transmission side voltage follower) 14.

In this manner, in the semiconductor device 1B according to the first modified example, the power supply potential and the ground potential for driving the send circuit 14 are supplied from wires connected to the dedicated pads 46 and 48.

In this event, it is based on the premise that a driving power supply for the receive circuit (the reception side voltage follower) 32 is supplied from the pads which are the same to the driving power supply for the send circuit (the transmission side voltage follower) 14. Accordingly, the driving power supply for the receive circuit (the reception side voltage follower) 32 is supplied from the dedicated pads 46 and 48 in vicinity to the transmission side via power supply feeding wires 101A. That is, the receive circuit (the reception side voltage follower) 32 is supplied with the stabilized power supply potential VDDR from the dedicated pad 46 in vicinity to the transmission side via the power supply feeding wire 101A and with the stabilized ground potential VSSR from the dedicated pad 48 in vicinity of the transmission side via the power supply feeding wire 101A.

In this manner, the semiconductor device 1B according to the first modified example, the power supply potential and the ground potential for driving the receive circuit 32 are supplied from the wires 101A connected to the dedicated pads 46 and 48 that are similar to those of the send circuit 14.

Now, description will be made as regards a special technical feature of the semiconductor device 1B according to the first modified example of the second exemplary embodiment of this invention.

In the manner which is described above, in the semiconductor device 1B according to the first modified example of the second exemplary embodiment of this invention, at both sides of the transmission wire 30, the pair of shield wires 50 in which the one (the first shield wire) 51 is fixed by the power supply potential VDD and the other (the second shield wire) 52 is fixed by the ground potential VSS is disposed so as to sandwich the transmission wire 30 therebetween. In particular, the power supply potential VDD and the ground potential VSS for fixing their shield lines are the power supply potential VDD and the ground potential VSS which drive the load driving circuit 24 (the second circuit 20), respectively.

That is, the semiconductor device 1B according to the first modified example of the second exemplary embodiment of this invention has the special technical feature (STF) which is similar to that of the semiconductor device 1 according to the above-mentioned first exemplary embodiment, as shown in FIG. 6.

Figure 15:
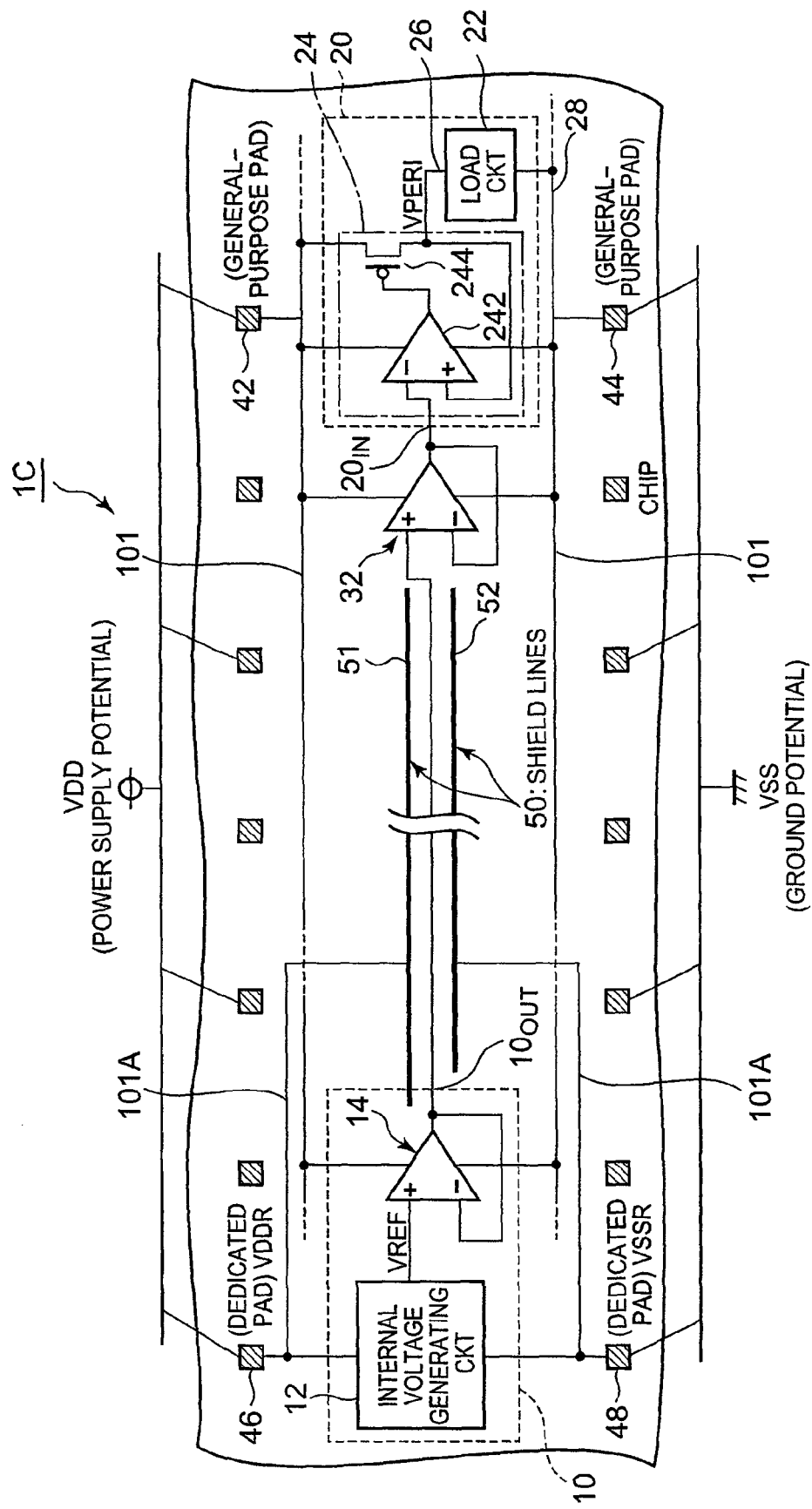
FIG. 15 is a block diagram showing a semiconductor device according to a second modified example of the second exemplary embodiment of this invention.

Referring to FIG. 15, the description will proceed to a semiconductor device 1C according to a second modified example of the second exemplary embodiment of this invention.

The illustrated semiconductor device 1C is similar in structure to the semiconductor device 1A illustrated in FIG. 13 except that a way of feeding to the pair of shield lines 50 is different from in the manner which will be described later. The same reference symbols are depicted to those having functions similar to components illustrated in FIG. 13 and the description will later proceed to the dissimilarities alone for the sake of simplification of the description.

That is, in the pair of shield lines 50, the one (the first shield line) 51 is supplied with the stabilized power supply potential VDDR via the dedicated pad 46 in vicinity to the transmission side and the other (the second shield line) 52 is supplied with the stabilized ground potential VSSR via the dedicated pad 48 in vicinity to the transmission side.

In this manner, by supplying the stabilized power supply potential VDDR and the stabilized ground potential VSSR for fixing the pair of shield lines 50 from the dedicated pads 46 and 48 in vicinity to the transmission side, it is possible to reduce the noises occurring in the pair of shield lines 50 per se.

In this manner, in the semiconductor device 1C according to the second modified example, the power supply potential and the ground potential for fixing the pair of shield lines 50 are supplied from the wires 101A connected to the dedicated pads 46 and 48.

Now, description will be made as regards a special technical feature of the semiconductor device 1C according to the second modified example of the second exemplary embodiment of this invention.

In the manner which is described above, in the semiconductor device 1C according to the second modified example of the second exemplary embodiment of this invention, at both sides of the transmission wire 30, the pair of shield wires 50 in which the one (the first shield wire) 51 is fixed by the stabilized power supply potential VDDR and the other (the second shield wire) 52 is fixed by the stabilized ground potential VSSR is disposed so as to sandwich the transmission wire 30 therebetween. In particular, the stabilized power supply potential VDDR and the stabilized ground potential VSSR for fixing their shield lines are the stabilized power supply potential VDDR and the stabilized ground potential VSSR which drive the internal voltage generating circuit 12, respectively.

That is, the semiconductor device 1C according to the second modified example of the second exemplary embodiment of this invention has the special technical feature (STF) which is similar to that of the semiconductor device 1 according to the above-mentioned first exemplary embodiment, as shown in FIG. 6.

Figure 16:
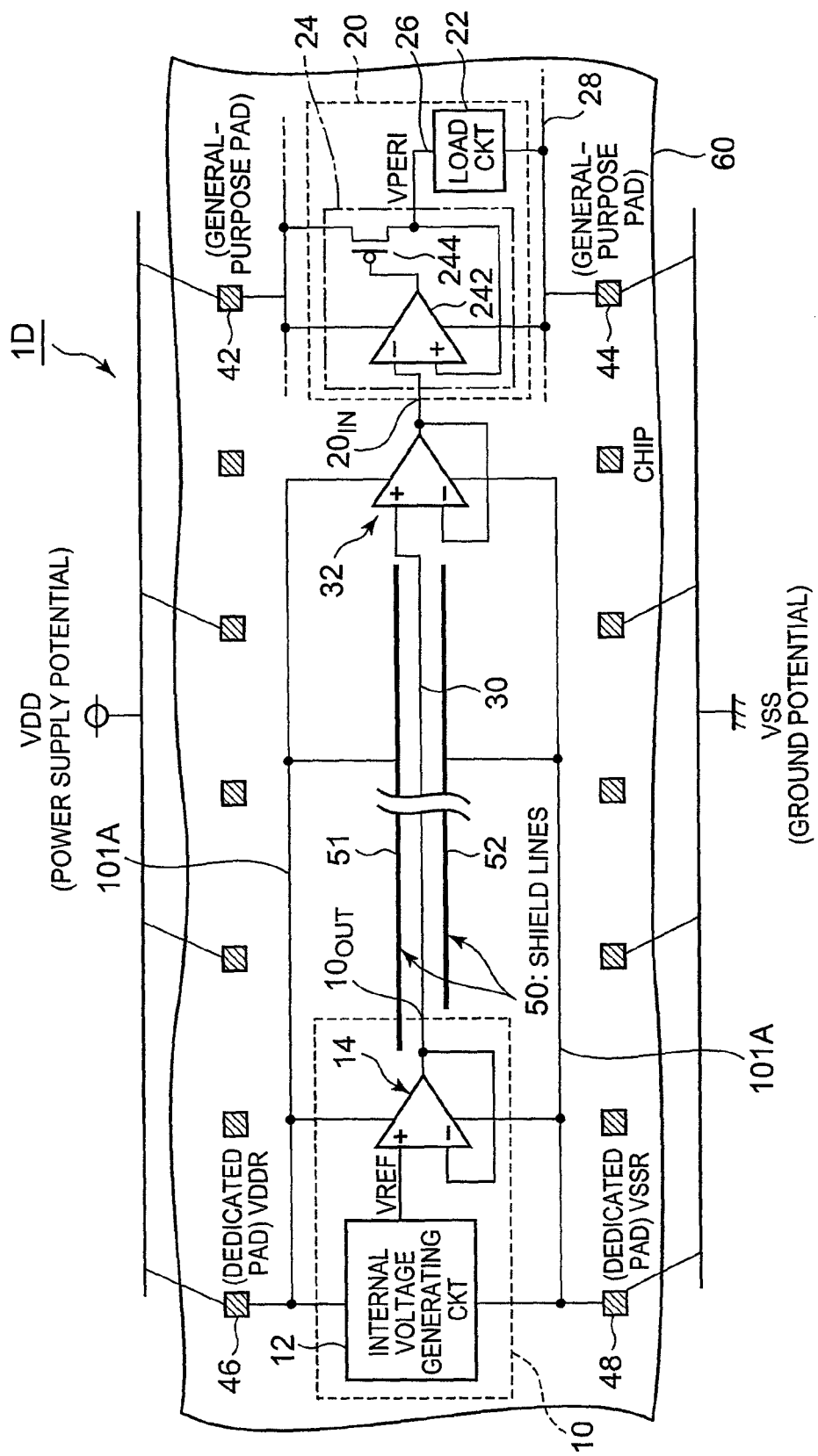
FIG. 16 is a block diagram showing a semiconductor device according to a third modified example of the second exemplary embodiment of this invention.

Referring to FIG. 16, the description will proceed to a semiconductor device 1D according to a third modified example of the second exemplary embodiment of this invention.

The illustrated semiconductor device 1D is similar in structure to the semiconductor device 1A illustrated in FIG. 13 except that a way of feeding to the send circuit 14, the receive circuit 32, and the pair of shield lines 50 is different from in the manner which will be described later. The same reference symbols are depicted to those having functions similar to components illustrated in FIG. 13 and the description will later proceed to the dissimilarities alone for the sake of simplification of the description.

A power supply for driving the send circuit (the transmission side voltage follower) 14 supplies from the dedicated pads 46 and 48 in vicinity to the transmission side. More specifically, the send circuit (the transmission side voltage follower) 14 is supplied with the stabilized power supply potential VDDR via the dedicated pad 46 in vicinity to the transmission side and with the stabilized ground potential VSSR via the dedicated pad 48 in vicinity to the transmission side.

Likewise, a driving power supply for the receive circuit (the reception side voltage follower) 32 supplies from the dedicated pads 46 and 48 in vicinity to the transmission side. More specifically, the receive circuit (the reception side voltage follower) 32 is supplied with the stabilized power supply potential VDDR from the dedicated pad 46 in vicinity to the transmission side via the power supply feeding wire 101A and with the stabilized ground potential VSSR from the dedicated pad 48 in vicinity to the transmission side via the power supply feeding wire 101A.

In addition, in the pair of shield lines 50, the one (the first shield line) 51 is supplied with the stabilized power supply potential VDDR from the dedicated pad 46 in vicinity to the transmission side via the power supply feeding wire 101A and the other (the second shield line) 52 is supplied with the stabilized ground potential VSSR from the dedicated pad 48 in vicinity to the transmission side via the power supply feeding wire 101A.

That is, the third modified example is analogous to a combination of the above-mentioned first example and the above-mentioned second example.

By adopting such a structure, it is possible to reduce noises occurring in the signal (e.g. transmission target signal) VREF per se that is produced by the send circuit (the transmission side voltage follower) 14. In addition, by supplying the stabilized power supply potential VDDR and the stabilized ground potential VSSR for fixing the pair of shield lines 50 from the dedicated pads 46 and 48 in vicinity to the transmission side, it is possible to reduce the noises occurring in the pair of shield lines 50 per se.

In this manner, in the semiconductor device 1D according to the third modified example, the power supply potential and the ground potential for driving the send circuit 14 are supplied from the wires 101A connected to the dedicated pads 46 and 48. And, the power supply potential and the ground potential for driving the receive circuit 32 are also supplied from the wires 101A connected to the dedicated pads 46 and 48 that are similar to those of the send circuit 14. Furthermore, the power supply potential and the ground potential for fixing the pair of shield lines 50 are also supplied from the wires 101A connected to the dedicated pads 46 and 48. In addition, a power supply for driving the internal voltage generating circuit 12 is supplied from the wires 101A connected to the dedicated pads 46 and 48.

Now, description will be made as regards a special technical feature of the semiconductor device 1D according to the third modified example of the second exemplary embodiment of this invention.

In the manner which is described above, in the semiconductor device 1D according to the third modified example of the second exemplary embodiment of this invention, at both sides of the transmission wire 30, the pair of shield wires 50 in which the one (the first shield wire) 51 is fixed by the stabilized power supply potential VDDR and the other (the second shield wire) 52 is fixed by the stabilized ground potential VSSR is disposed so as to sandwich the transmission wire 30 therebetween. In particular, the stabilized power supply potential VDDR and the stabilized ground potential VSSR for fixing their shield lines are the stabilized power supply potential VDDR and the stabilized ground potential VSSR which drive the internal voltage generating circuit 12, respectively.

That is, the semiconductor device 1D according to the third modified example of the second exemplary embodiment of this invention has the special technical feature (STF) which is similar to that of the semiconductor device 1 according to the above-mentioned first exemplary embodiment, as shown in FIG. 6.

Figure 17:
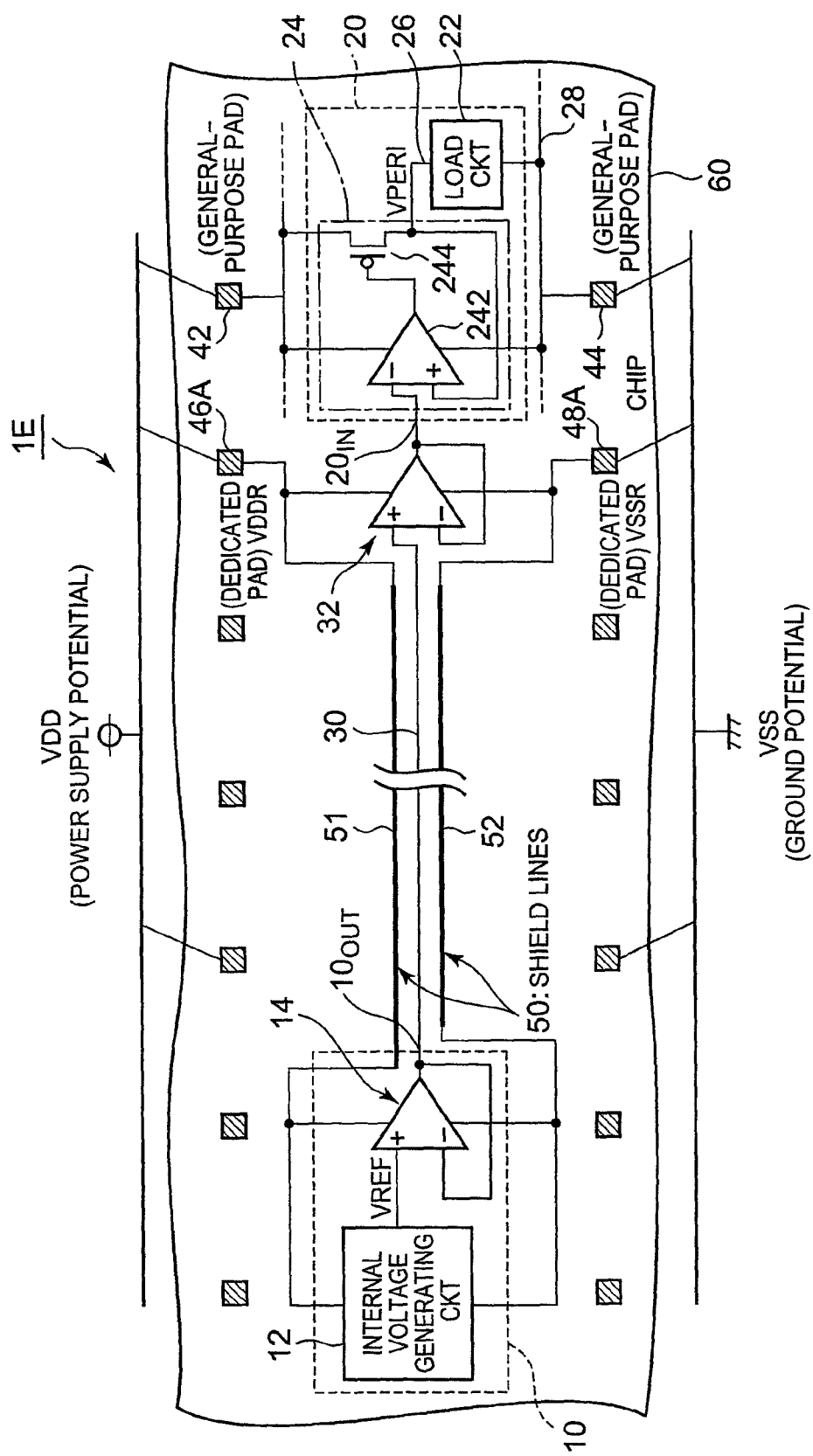
FIG. 17 is a block diagram showing a semiconductor device according to a fourth modified example of the second exemplary embodiment of this invention.

Referring to FIG. 17, the description will proceed to a semiconductor device 1E according to a fourth modified example of the second exemplary embodiment of this invention.

The illustrated semiconductor device 1E is similar in structure to the semiconductor device 1D illustrated in FIG. 16 except that the pair of shield lines 50 is also used as the power supply feeding wires. The same reference symbols are depicted to those having functions similar to components illustrated in FIG. 16 and the description will later proceed to the dissimilarities alone for the sake of simplification of the description.

In the semiconductor device 1D illustrated in FIG. 16, the internal voltage generating circuit 12 and the send circuit 14 are supplied with the stabilized power supply potential VDDR and the stabilized ground potential VSSR from the dedicated pads 46 and 48 in vicinity of the transmission side. And, the pair of shield lines 50 and the receive circuit 32 are supplied with the stabilized power supply potential VDDR and the stabilized ground potential VSSR from the dedicated pads 46 and 48 in vicinity of the transmission side via the power supply feeding wires 101A.

In contrast to this, in the semiconductor device 1E illustrated in FIG. 17, the receive circuit 32 and the pair of shield lines 50 are supplied with the stabilized power supply potential VDDR and the stabilized ground potential VSSR from dedicated pads 46A and 48A in vicinity of the reception side. And, the send circuit 14 and the internal voltage generating circuit 12 are supplied with the stabilized power supply potential VDDR and the stabilized ground potential VSSR from the dedicated pads 46A and 48A in vicinity of the reception side not via the power supply feeding wires, but via the pair of shield lines 50.

In this manner, by using the pair of shield lines 50 as the power supply feeding wires also, it is possible to simplify a three-layer metal wire formed in the insulating film 90, as shown in FIG. 12B. That is, it is possible to omit the third metal layer 101 for supplying the power supply potential VDD and the ground potential VSS.

The semiconductor device 1E having such a structure is effective in a case where a transmission portion (the internal voltage generating circuit 12 and the send circuit 14) and a reception portion (the receive circuit 32, the load driving circuit 24, and the load circuit 22) are apart from each other.

Although the stabilized power supply potential VDDR and the stabilized ground potential VSSR are supplied from the dedicated pads 46A and 48A in vicinity of the reception side in the semiconductor device 1E illustrated in FIG. 17, the stabilized power supply potential VDDR and the stabilized ground potential VSSR may be supplied from the dedicated pads 46 and 48 in vicinity of the transmission side. In this event, the internal voltage generating circuit 12, the send circuit 14, and the pair of shield lines 50 are supplied with the stabilized power supply potential VDDR and the stabilized ground potential VSSR from the dedicated pads 46 and 48 in vicinity of the transmission side. In addition, the receive circuit 32 is supplied with stabilized power supply potential VDDR and the stabilized ground potential VSSR from the dedicated pads 46 and 48 in vicinity of the transmission side not via the power supply feeding wires, but via the pair of shield lines 50.

The fourth modified example is effective in a case of wishing to omit the wiring layer having a long-distance while the above-mentioned first through third modified examples are effective in a case of wishing to decrease more the effect of the noises.

Figure 18:
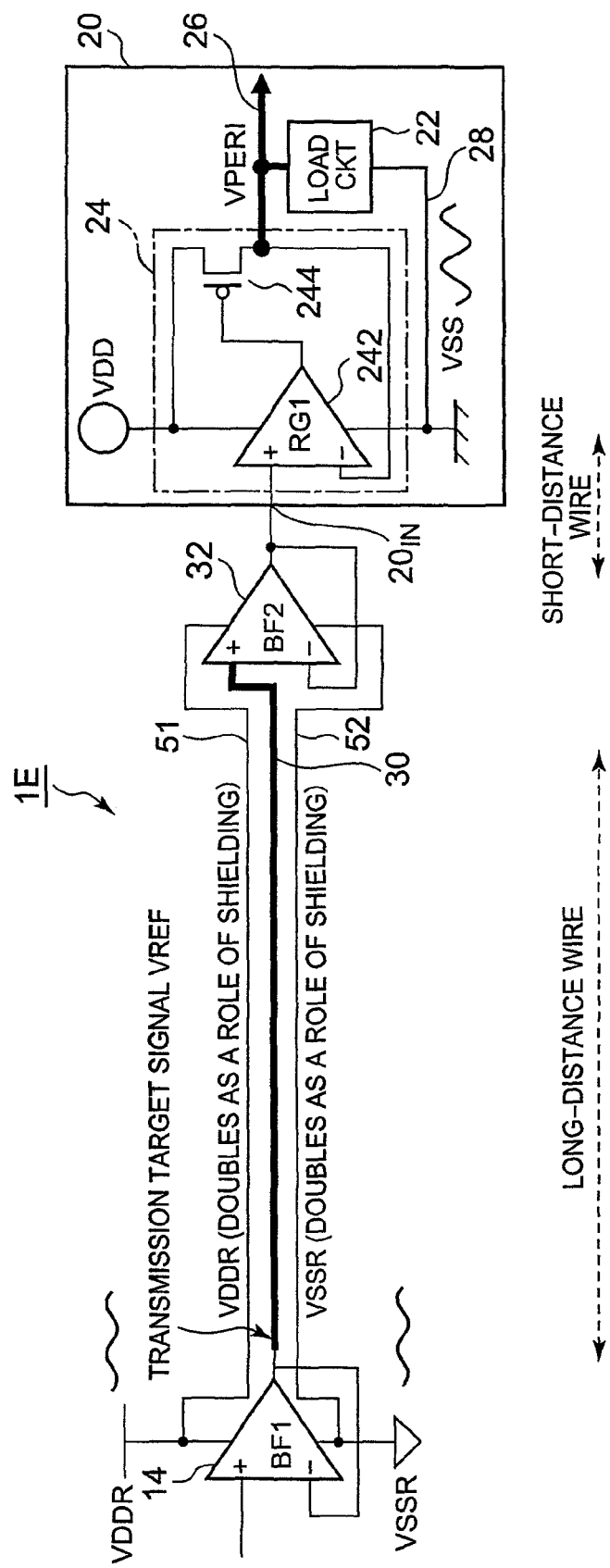
FIG. 18 is a block diagram showing the semiconductor device according to the fourth modified example of the second exemplary embodiment, for use in describing an operation-effect of the semiconductor device illustrated in FIG. 17, with an internal voltage generating circuit omitted

Referring now to FIG. 18, description will be made as regards an operational effect of the semiconductor device 1E according to the fourth modified example of the second exemplary embodiment. FIG. 18 is a block diagram showing the semiconductor device 1E but omits illustration of the internal voltage generating circuit 12 provided in the first circuit (the control portion) 10.

In the manner which is described above, in the semiconductor device 1E, in the pair of shield lines 50 for shielding the transmission wire 30, the one (the first shield line) 51 is supplied with the stabilized power supply potential VDDR while the other (the second shield line) 52 is supplied with the stabilized ground potential VSSR.

In a case where the one (the first shield line) 51 of the pair of shield lines 50 is shielded in long-distance by the stabilized power supply potential VDDR while the other (the second shield line) 52 thereof is shielded in long-distance by the stabilized ground potential VSSR in this manner, the stabilized power supply VDDR (VSSR) has a little charging/discharging current and little fluctuations in comparison with the power supply VDD (VSS). It is therefore possible to expect a larger effect by applying the stabilized power supply potential VDDR and the stabilized ground potential VSSR as potentials for shielding the transmission wire 30.

In addition, by providing the receive circuit 32 using a power supply system VDDR-VSSR which is similar to that of the send circuit 14 of the transmission side, it is possible to suppress output fluctuations of the receive circuit 32 because a difference of input potentials of the receive circuit 32 does not change although in-phase noises apply on the long-distance wires.

In this manner, in the semiconductor device 1E according to the fourth modified example, the pair of shield wires 50 is composed of the wires for supplying the power supply potential ad the ground potential to the send circuit 14, the receive circuit 32, or the internal voltage generating circuit 12.

Now, description will be made as regards a special technical feature of the semiconductor device 1E according to the fourth modified example of the second exemplary embodiment of this invention.

In the manner which is described above, in the semiconductor device 1E according to the fourth modified example of the second exemplary embodiment of this invention, at both sides of the transmission wire 30, the pair of shield wires 50 in which the one (the first shield wire) 51 is fixed by the stabilized power supply potential VDDR and the other (the second shield wire) 52 is fixed by the stabilized ground potential VSSR is disposed so as to sandwich the transmission wire 30 therebetween. In particular, the stabilized power supply potential VDDR and the stabilized ground potential VSSR for fixing their shield lines are the stabilized power supply potential VDDR and the stabilized ground potential VSSR which drive the internal voltage generating circuit 12, respectively.

That is, the semiconductor device 1E according to the fourth modified example of the second exemplary embodiment of this invention has the special technical feature (STF) which is similar to that of the semiconductor device 1 according to the above-mentioned first exemplary embodiment, as shown in FIG. 6.

While the invention has been particularly shown and described with reference to exemplary embodiments thereof, the invention is not limited to these embodiments. It will be understood by those of ordinary skilled in the art that various changes in form and details may be made therein without departing from the spirit and scope of the present invention as defined by the claims.

For example, although the description has been made so that the pair of shield lines 50 is disposed so as to sandwich the transmission wire 30 therebetween in the above-mentioned exemplary embodiments, a position of disposition thereof may be so that the pair of shield lines 50 are disposed from side to side on the transmission wire 30 or are disposed from up to down thereon. That is, the pair of shield lines 50 of this invention may be disposed so as to sandwich the transmission wire 30 therebetween and is not limited to a particular position of disposition thereof.

The first through the fourth modified examples of the above-mentioned second exemplary embodiment may be applied to the first exemplary embodiment. To be more specific, structure without the receive circuit 32 may be in the first through the fourth modified examples of the second exemplary embodiment.

In addition, the above-mentioned pair of shield lines 50 is not limited to one set and may be a plurality of sets.

Furthermore, although the description has been made so that the reference voltage VREF generated by the internal voltage generating circuit 12 is applied to and transmitted on the transmission wire 30 to be protected from the noises by the pair of shield lines 50, a signal applied to the transmission wire 30 is not limited to this. For example, the signal may be a command signal for determining a driving condition of various circuits or the like.

The technical ides of the semiconductor device of this invention can be applicable to various semiconductor devices. For example, this invention can be applicable to the semiconductor products in general such as a CPU (Central Processing Unit), an MCU (Micro Control Unit), a DSP (Digital Signal Processor), an ASIC (Application Specific Integrated Circuit), an ASSP (Application Specific Standard Circuit), and so on each of which has an information storage function. In addition, a device to which this invention is applicable can be applied to semiconductor devices such as a SOC (System On Chip), an MCP (Multi Chip Package), a POP (Package On Package), or the like. In addition, the transistors may be field effect transistors (FETs). The transistors can be applicable to various FETs such as not only MOS (Metal Oxide Semiconductor) but also MIS (Metal-Insulator Semiconductor), TFT (Thin Film Transistor), or the like. The transistors may be transistors other than the FETs. In addition, P-channel type transistors or PMOS transistors act on behalf of first conductive-type transistors while N-channel type transistors or NMOS transistors act on behalf of second conductive-type transistors. Furthermore, the semiconductor substrate is not limited to a P-type semiconductor substrate and may be an N-type semiconductor substrate, a semiconductor substrate having SOI (Silicon on Insulator), a semiconductor substrate other then those.

What is claimed is:

1. A device, comprising:
   a first circuit including a voltage generating circuit generating a predetermined voltage, the first circuit producing the predetermined voltage at an output end thereof;
   a second circuit having an input end;
   a first wire connecting the output end of the first circuit with the input end of the second circuit; and
   a pair of shield lines disposed so as to sandwich the first wire therebetween, one of the pair of shield lines being supplied with a power supply potential for driving at least one of the voltage generating circuit and the second circuit, another of the pair of shield lines being supplied with a ground potential for driving at least one of the voltage generating circuit and the second circuit.

2. The device as claimed in claim 1, wherein the first circuit, the second circuit, the first wire, and the pair of shield lines are formed on the same semiconductor chip.

3. The device as claimed in claim 2, wherein the first circuit further comprises a send circuit controlling the first circuit so that the output end of the first circuit has a voltage equal to the predetermined voltage, the first circuit producing the predetermined voltage on the first wire via the send circuit.

4. The device as claimed in claim 3, wherein the first wire is connected to the input end of the second circuit via a receive circuit, the receive circuit being a circuit controlling the second circuit so that the input end of the second circuit has a voltage equal to the predetermined voltage of the first wire, wherein the device further comprises wires for supplying the power supply potential and the ground potential to the receive circuit that are connected to pads which are connected to wires for supplying the power supply potential and the ground potential to the send circuit.

5. The device as claimed in claim 4, wherein the first circuit comprises an internal voltage generating circuit as the voltage generating circuit, the predetermined voltage being a reference voltage generated by the internal voltage generating circuit.

6. The device as claimed in claim 5, wherein the device comprises wires for supplying the power supply potential and the ground potential to the internal voltage generating circuit that are connected to pads different from pads connected to wires for supplying the power supply potential and the ground potential to other circuits on the semiconductor chip.

7. The device as claimed in claim 6, wherein the power supply potential and the ground potential for fixing the pair of shield lines are supplied from the pads connected to the wires for supplying the power supply potential and the ground potential to the internal voltage generating circuit.

8. The device as claimed in claim 6, wherein the wires for supplying the power supply potential and the ground potential to the send circuit and the receive circuit are connected to the pads which are connected to the wires supplying the power supply potential and the ground potential to the internal voltage generating circuit.

9. The device as claimed in claim 8, wherein the power supply potential and the ground potential for fixing the pair of shield lines are supplied from the pads connected to the wires for supplying the power supply potential and the ground potential to the send circuit and the receive circuit.

10. The device as claimed in claim 9, wherein the pair of shield lines configures a part of wires for supplying the power supply potential and the ground potential to the send circuit, the receive circuit, or the internal voltage generating circuit.

11. The device as claimed in claim 1, wherein the second circuit comprises a load driving circuit driving a load circuit in response to the predetermined voltage on the first wire.

12. The device as claimed in claim 11, wherein the load driving circuit comprises:

a first transistor having first and second main electrodes and a control electrode; and a control circuit controlling a voltage between the second main electrode and the control electrode of the first transistor so that a voltage of the first main electrode of the first transistor becomes the predetermined voltage, the load driving circuit supplying the voltage of the first main electrode of the first transistor to the load circuit.

13. The device as claimed in claim 1, wherein the pair of shield lines comprises a plurality of sets.

14. A device, comprising:

a control portion including a voltage generating circuit and controlling a voltage of a first wire in accordance with a predetermined voltage;

a driving portion operating by the voltage of the first wire; and a pair of shield lines disposed via a insulating film along the first wire, one of the pair of shield lines being fixed by a power supply potential which is supplied to at least one of the voltage generating circuit and the driving portion and another of the pair of shield lines being fixed by a ground potential which is supplied to at least one of the voltage generating circuit and the driving portion.

15. A device, comprising:

a first wire;

a control portion controlling a voltage of the first wire;

a driving portion operating by the voltage of the first wire; and a pair of shield lines disposed so as to sandwich the first wire therebetween, one of the pair of shield lines being connected to a pad which is connected to a wire supplying a power supply potential to at least one of the control portion and the driving portion, another of the pair of shield lines being connected to another pad which is connected to another wire supplying a ground potential to at least one of the control portion and the driving portion.

* * * * *